United States Patent [19]

Sakata et al.

[11] Patent Number: 5,517,752
[45] Date of Patent: May 21, 1996

[54] METHOD OF CONNECTING A PRESSURE-CONNECTOR TERMINAL OF A DEVICE WITH A TERMINAL ELECTRODE OF A SUBSTRATE

[75] Inventors: Toshio Sakata; Takashi Yuda; Shinichi Kasahara; Toshiaki Sukeda; Hiromichi Watanabe; Yoshiaki Maruyama; Eiji Nittoh; Kenichi Kuroiwa; Hiroaki Kobayashi, all of Kawasaki, Japan

[73] Assignee: Fujitsu Limited, Kawasaki, Japan

[21] Appl. No.: 61,086

[22] Filed: May 13, 1993

[30] Foreign Application Priority Data

| May 13, 1992 | [JP] | Japan | 4-119363 |
| Oct. 7, 1992 | [JP] | Japan | 4-267752 |
| Dec. 18, 1992 | [JP] | Japan | 4-339044 |
| Apr. 22, 1993 | [JP] | Japan | 5-094728 |

[51] Int. Cl.⁶ .................................................. H05K 3/30
[52] U.S. Cl. ............................ 29/832; 29/840; 174/260
[58] Field of Search ........................... 174/259, 254, 174/260; 29/840, 846, 832; 257/774, 668; 439/209

[56] References Cited

U.S. PATENT DOCUMENTS

| 3,239,719 | 3/1966 | Shower. | |
| 3,379,937 | 4/1968 | Shepherd | 174/260 X |
| 3,818,279 | 6/1974 | Seeger, Jr. et al. | 174/254 X |
| 4,294,572 | 9/1987 | Leber et al. | 29/846 X |
| 4,774,633 | 9/1988 | Dettaine et al. | 257/774 X |
| 4,811,081 | 3/1989 | Lyden | 257/668 |
| 4,818,728 | 4/1989 | Rai et al. | 437/209 |
| 4,818,823 | 4/1989 | Bradley | 174/259 |
| 4,955,132 | 9/1990 | Ozawa | 29/840 |
| 5,077,633 | 12/1991 | Freyman et al. | 174/260 X |
| 5,266,748 | 11/1993 | Kawakami et al. | 174/260 X |

FOREIGN PATENT DOCUMENTS

| 2-111093 | 4/1990 | Japan | 29/840 |
| 5-74849 | 3/1993 | Japan | 174/254 |

*Primary Examiner*—Carl J. Arbes
*Attorney, Agent, or Firm*—Staas & Halsey

[57] ABSTRACT

A method for establishing electrical connection of a pressure-connector terminal by forming a plurality of divided terminals by providing a plurality of grooves on a connecting surface of a pressure-connector terminal used for TAB connection and COG connection, placing such divided connecting surfaces in contact with a connecting surface of an opposed terminal electrode, imperfectly hardening a bonding material under such condition, deforming a divided terminal by applying pressure and thereafter perfectly hardening the bonding material and a configuration of the pressure-connector terminal are disclosed.

24 Claims, 24 Drawing Sheets

FIG. 9(a)
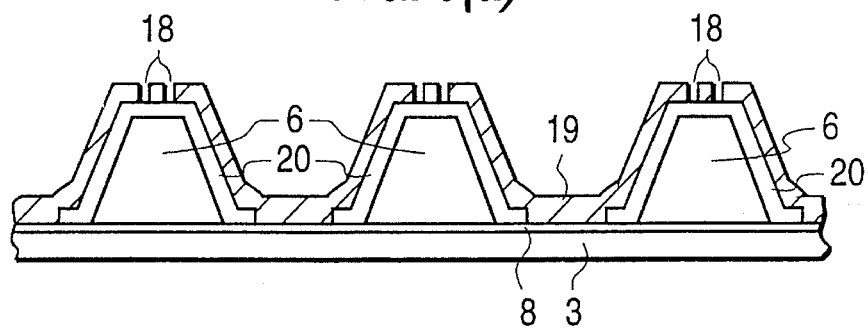
FIG. 9(b)
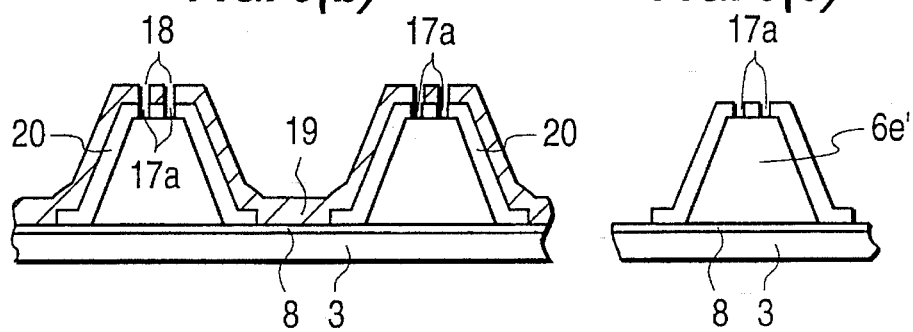
FIG. 9(c)
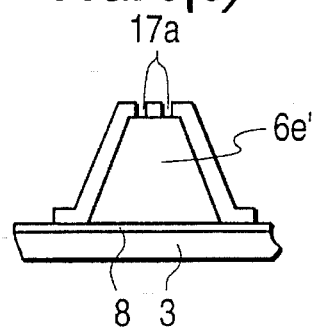
FIG. 10(a)
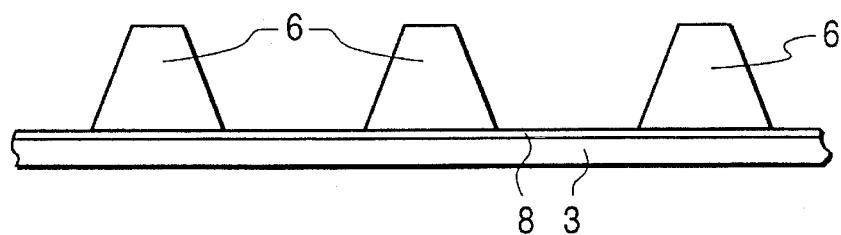
FIG. 10(b)
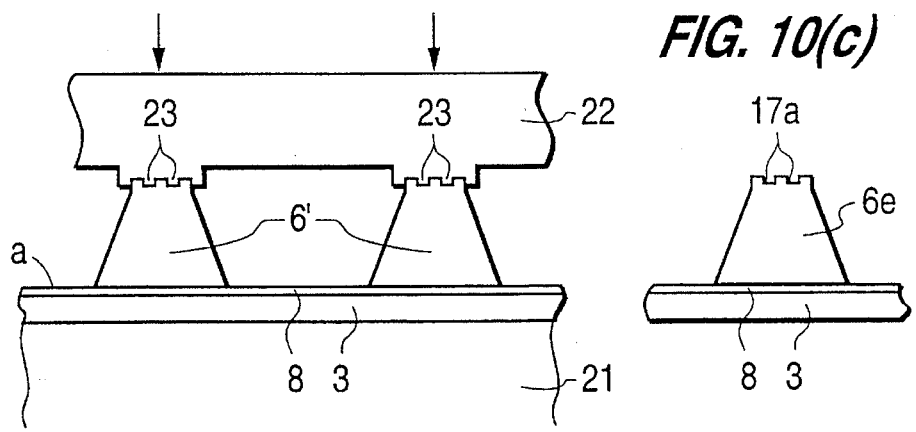
FIG. 10(c)

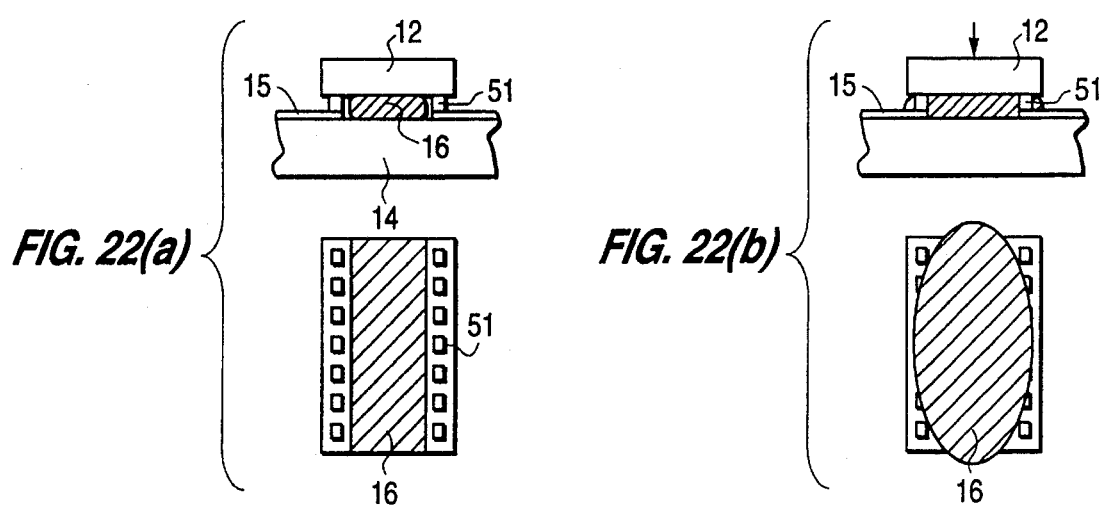
FIG. 22(a)
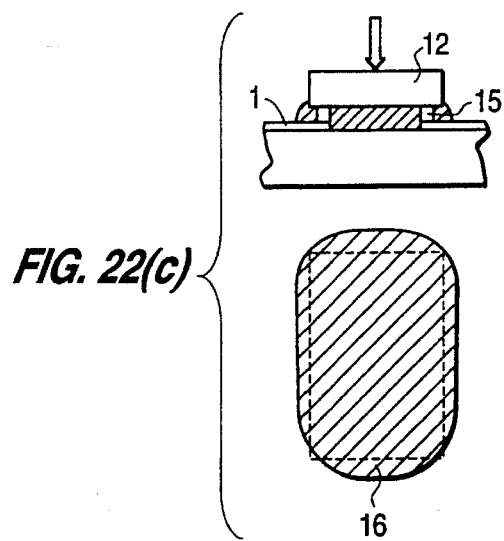
FIG. 22(b)
FIG. 22(c)

METHOD OF CONNECTING A PRESSURE-CONNECTOR TERMINAL OF A DEVICE WITH A TERMINAL ELECTRODE OF A SUBSTRATE

BACKGROUND OF THE INVENTION

1. Field of the Invention

The present invention relates to an improvement in constitution of pressure-connector terminal of a semiconductor device connected to a terminal electrode of a substrate and in a method for connecting thereof.

With continuous effort made for realizing higher level of integration and packing density of LSI in these years, the number of pressure-connector terminals of a semiconductor device increases, while the size thereof decreases. Therefore, it is required for the semiconductor device that individual pressure-connector terminal ensures reliable contact with a corresponding opposite terminal electrode and all pressure-connector temrinals are reliably connected with the opposite terminal electrodes. Moreover, it is also required that a contact resistance value is constant for the all pressure-connector terminals. As explained above, high level reliability is always required recently for connection between pressure-connector terminals and terminal electrodes.

2. Description of the Related Art

Conventional terminal structure and connecting method thereof will then be explained hereunder, taking an example of connection between a pressure-connector terminal and an opposite terminal electrode in a liquid crystal display apparatus into consideration.

FIG. 1 is a plan view illustrating a configuration of a display unit of a liquid crystal display apparatus. In this figure, a liquid crystal display panel 1 and printed wiring substrates 2 are connected with an IC chip 5 (not illustrated) mounted on an insulating film 3. The printed wiring substrates 2 are mutually connected with jumper cables 4.

FIG. 2 illustrates a configuration of IC chip 5 and pattern leads 6, 7 mounted on the insulating film 3. The pattern lead 6 connects terminal electrodes (not illustrated) formed on the liquid crystal display panel 1 and the IC chip 5 and the pattern lead 7 connects pattern leads (not illustrated) formed on the printed wiring substrate 2 and the IC chip 5.

FIG. 3 is a diagram prepared for convenience of explaining the conventional connecting method called a TAB (Tape Automated Bonding) for connecting terminal electrodes and pattern leads. In this figure, a terminal electrode 11 formed on a glass substrate 1a of the liquid crystal display panel 1 is electrically connected with a pressure-connector terminal 6a provided at the end of a pattern lead 6 provided opposed to such terminal electrode 11 via conductive particles 10 included in a bonding material 9. Such bonding material film is called ACF (Anisotropic Conductive Film). Since the pattern leads 6, 7 are formed by etching copper foil bonded with a bonding material 8 on the insulating film 3, the sectional area of the pattern leads is shaped as a trapezoid, owing to the side etching effect. The bonding material 9 is formed of a thermosetting resin or photosetting resin and maintains connection between the terminal electrode 11 and pressure-connector terminal 6a with a contraction stress generated when the bonding material 9 filling the area between the glass substrate 1a and insulation film 3 is hardened.

A pattern lead 6 is generally formed on the insulation film 3 with a pitch of 50 μm and the bottom side of a trapezoid has a length of 25 μm, while the upper bottom, namely width of pressure-connector terminal 6a has the length of 5 to 10 μm. In the case where the contact areas between the surfaces of pressure-connector terminal 6a and terminal electrode 11 are selected, for example, to about 20 points in the electrical contact of the terminal electrode 11 and pressure-connector terminal 6a, it is necessary to provide conductive particles 10. Meanwhile, a grain size of conductive particle 10 is set to 5 μm or larger, only one conductive particle 10 can exist at most in the width direction of the pressure-connector terminal 6a. When the pressure-connector terminal 6a is placed in contact with the terminal electrode 11, the conductive particles 10 of the bonding material 9 at the region where the respective contact surfaces of the pressure-connector terminal 6a and the terminal electrode 11 are provided opposed with each other flow toward the external side of the pressure-connector terminal 6a. Therefore, the conductive particles 10 flow out of such region before the bonding material 9 is hardened, or the conductive particles 10 do not flow out perfectly as shown in the center of FIG. 3 and remain in this region in unstable condition. Generally, 20 or more conductive particles 10 must be provided at the connecting area of the pressure-connector terminal 6a and terminal electrode 11. In the connecting area of the pressure-connector terminal 6a and terminal electrode 11 where connection of conductive particles 10 are insufficient, a connecting resistance between the liquid crystal display panel 1 and IC chip 5 becomes large. Moreover, if resistance values of respective connecting areas are varied, reliability of terminal connection is remarkably lowered.

On the other hand, a terminal connecting method using a bonding material not including conductive particles has also been used for the mounting of semiconductor chips. FIG. 4 is a diagram prepared for explaining a conventional connecting method for connecting the terminal electrodes on the substrate and bumps for IC chips. In this figure, a plurality of bumps (pressure-connector terminals) 13 in such a size of about 50 μm×50 μm are formed on the lower surface (face) of the semiconductor chip 12, while the terminal electrodes 15 connected to the corresponding bumps 13 are also formed on the glass substrate 14. In order to obtain good electrical connections, a flatness error of respective contact surfaces of a plurality of bumps 13 and terminal electrodes 15 is designed to 2 μm or lower. After establishing the contact between bumps 13 and terminal electrodes 15, a gap between the semiconductor chip 12 and glass substrate 12 is filled with a thermosetting or photosetting resin bonding material 16. Electrical connection between the bumps 13 and terminal electrodes 15 is maintained with a contraction stress of the hardened boding material 16. However, when a size of semiconductor chip 12 becomes larger and an area of a bump exceeds 50 μm×50 μm (in the case of connection between the liquid crystal display panel 1 and IC chip 5, explained above), it is extremely difficult to control a flatness error of the contact surface of bump 13 to 2 μm or lower. In addition, contactness between the bumps 13 and terminal electrodes 15 is actually realized in several areas on the contact surface and it is far from possibility for all terminals to have a small contact resistance value.

In the case of the bump 13 and terminal electrodes 15 shown in FIG. 4, a small quantity of bonding material 16 still remains in the area between the bump 13 and terminal electrode 15, it is then hardened to become an insulating film resulting in an event that an electrical contact resistance between the bump 13 and terminal electrode 15 increases.

As a method of overcoming this problem, the Japanese Patent Laid-Open No. HEI 3-142942 discloses a method for forming a stylus or lump type metal protrusion on the surface of pressure-connector terminal with the electrodeposition method. However, in this method, since a metal protrusion is formed by the electrodeposition method, the metal protrusion is peeled, easily generating electrical short-circuit between pressure-connector terminals. Therefore, it is restricted to make smaller the pitch of the pressure-connector terminals.

From the viewpoint of the mounting of device, it is desirable that good or no-good connecting condition of a large amount of pressure-connector terminals can be discriminated in the course of mounting. However, it has been impossible in the conventional method to inspect the connecting condition until the mounting is completed, even if a defective point has been found.

Meanwhile, the Japanese Patent Laid-Open No. SHO 62-132331 discloses a method for solving this problem. FIG. 5 is a diagram prepared for explaining the method of the above reference for preventing diffusion of a bonding material into the connecting area of the terminal electrode and bump for IC chip on the substrate.

As shown in FIG. 5(a), a small amount of first resin 3 is provided at a place on a wiring substrate 1, where is almost the center of an IC chip 4 fixed later. The quantity of first resin is restricted, as shown in FIG. 5(b), to such a degree that the first resin 3 extends but does not reach the pad 5 and the wiring 2' when the pad 5 of IC chip 4 is aligned on the wiring 2' on the wiring substrate 1 and the IC chip 4 is pressed to the wiring board 1 with a pressure application tool 6. Therefore, the first resin 3 never enter the area located between the pad 5 and wiring 2'. Next, after the first resin 3 is hardened, the pressure being applied by the pressure application tool 6 is released and thereby electrical connection between the pad 5 and wiring 2' can be maintained. Thereafter, as shown in FIG. 5(c), the area between the IC chip 4 and wiring substrate 1 is filled with a second resin 7 for ensuring the more rigid bonding.

However, in the method disclosed in FIG. 5, nonuniform stress is generated in the IC chip 2, since the hardend first resin 3 is located at the central portion of the IC chip 4. This causes easily degradation of the contact resistance.

SUMMARY OF THE INVENTION

It is therefore an object of the present invention to provide a structure of pressure-connector terminal which ensures maximum effective contact area between a pressure-connector terminal of a semiconductor device and a terminal electrode of a substrate and a method for connecting thereof.

It is another object of the present invention to provide a highly reliable method for connecting a pressure-connector terminal and a terminal electrode.

The objects explained above are all achieved by the following description, namely;

a pressure-connector terminal comprising, for the connection of a pressure-connector terminal provided at one end of a pattern lead formed on an insulating film to a corresponding terminal electrode formed on a substrate, a plurality of grooves formed on the upper surface (connecting surface) of the pressure-connector terminal, divided connecting surfaces which are defined by the grooves for connection with the terminal electrodes provided opposed thereto and bonding material filling the area between the insulation film and opposed substrate to maintain connection between the pressure-connector terminal and terminal electrode; and a method for connecting the pressure-connector terminal comprising the steps of providing a thermosetting bonding material between an insulation film forming the pressure-connector terminal and the substrate forming the terminal electrode provided opposed to the insulation film, making in contact the pressure-connector terminal with the terminal electrode formed on the substrate provided opposed thereto by softening the bonding material, removing the bonding material from the contact area of the terminal electrode provided opposed to the pressure-connector terminal and hardening the bonding material after applying a pressure in vertical to the contact surface to maintain the connection of terminal electrode provided opposed to the pressure-connector terminal with a contraction stress of the bonding material.

In the case where a pressure-connector terminal is formed by patterning a metal film, conductive particles are not provided within the bonding material. In comparison with the surface contact in the prior art, the effective contact area increases because the connecting surfaces of the divided terminal (hereinafter referred to as divided connecting surfaces) can be sequentially placed in contact with the corresponding opposite terminal electrode surfaces when the terminal areas defined by the grooves (hereinafter referred to as divided terminals) freely deform (crushed) with an externally applied contraction force. The areas of divided connecting surfaces should preferably be determined considering that the bonding material is never caught between the divided connecting surfaces and opposite terminal electrodes. In addition, the bonding material supplied to fill the grooves results in the effect of increasing a contraction stress for maintaining the good connecting condition.

When the pressure-connector terminal is formed on the pad formed on the IC chip, the effective contact area also increases in comparison with the conventional surface contact. Moreover, the bonding material supplied to fill the grooves also provide the effect, in the same manner, of increasing the contraction stress for maintaining the better connecting condition more than that in such a case that the grooves are not provided.

According to another aspect of the present invention, it is not required to limit the flatness error of the contact surface of a bump to 2 μm or lower, because if the flatness error of about 2 μm exists, the divided connecting surfaces are sequentially connected with a pressing force and at lest one or larger number of divided connecting surfaces are connected.

In view of solving the problem that a bonding material remains between the bumps and terminal electrodes, the quantity of bonding material is controlled so that it cannot enter the area between the bumps and terminal electrodes under the condition that the bumps and terminal electrodes are in the contact condition and the bonding material spreads to cover the connecting area of the bumps and terminal electrodes only when the divided terminals of bumps are crushed when the additional pressure is further applied. This method effectively prevents generation of an insulating film between the bumps and terminal electrodes, since the bonding material can no longer diffuse into the connecting surfaces of the crushed divided terminals and terminal electrodes.

Moreover, the entire surface of the IC chip is bonded by the bonding material and therefore not only nonuniform stress is generated on the IC chip but also the connecting area at the connecting surface between the divided terminals and terminal electrodes never indicates any change with the passage of time.

Moreover, a contact resistance of bumps and terminal electrodes can be examined by temporarily connecting the bumps with terminal electrodes through incomplete hardening of the bonding material under the condition that the bumps are in contact with the terminal electrodes.

As a result, reliability of electrical connection between pressure-connector terminal and terminal electrode can be improved.

BRIEF DESCRIPTION OF THE DRAWINGS

FIGS. 9(a)–9(c) show diagrams for explaining a method for manufacturing a pressure-connector terminal;

FIGS. 10(a)–10(c) show diagrams for explaining a method for manufacturing a pressure-connector terminal;

FIGS. 22(a)–22(c) show diagrams for explaining profiles of diffused bonding material when an IC chip is applied with pressure;

DESCRIPTION OF THE PREFERRED EMBODIMENTS

Figure 1:
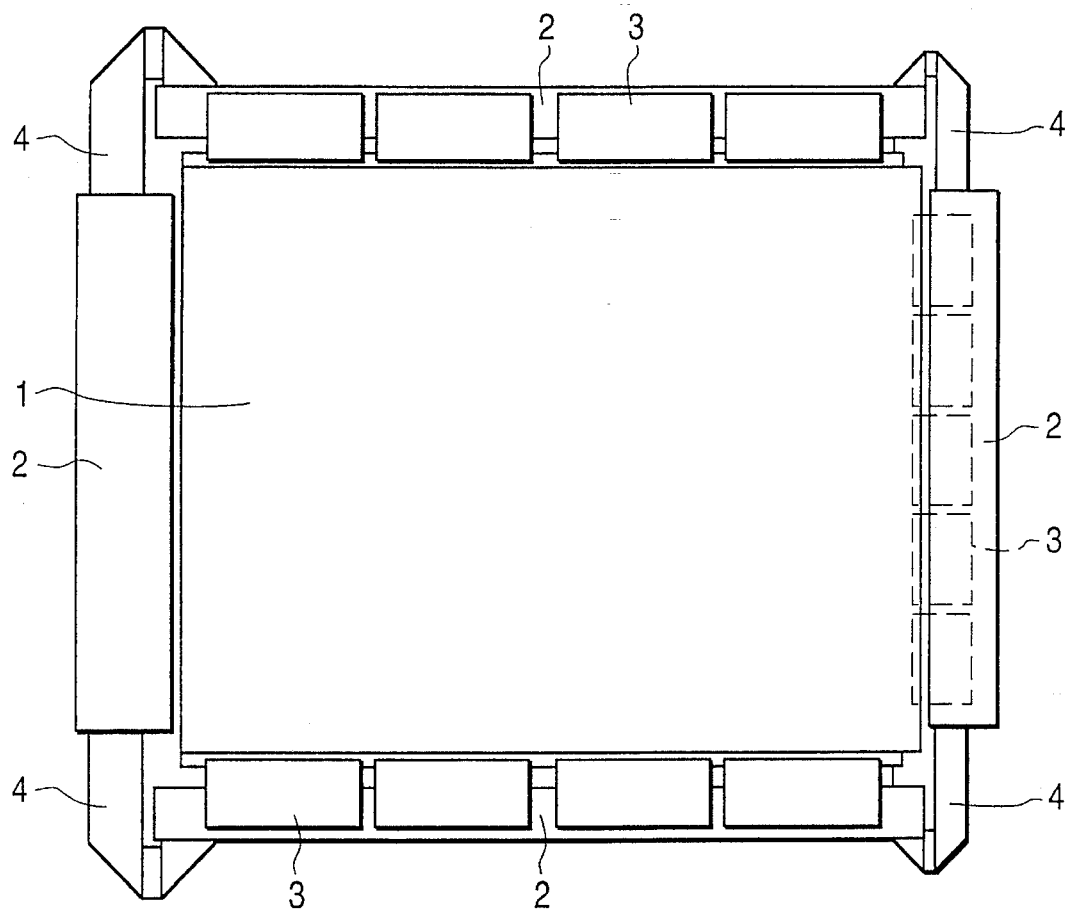
FIG. 1 is a plan view indicating a construction of a display unit of a liquid crystal display apparatus.
Figure 2:
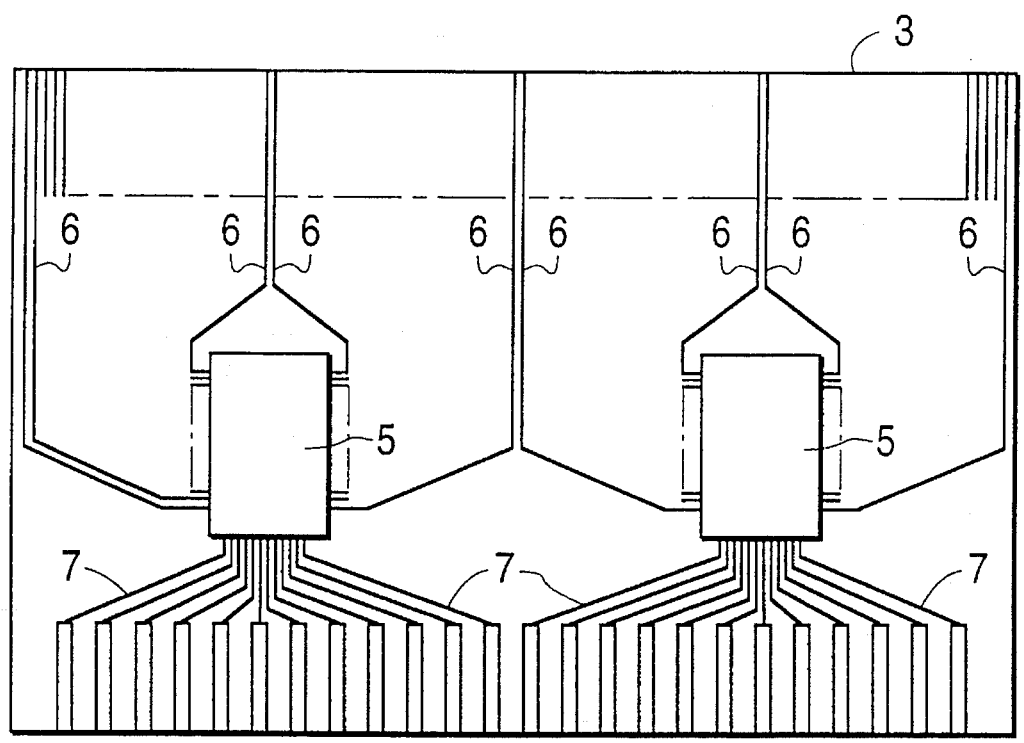
FIG. 2 is a diagram indicating a configuration of IC chips and pattern leads mounted on an insulation film.
Figure 3:
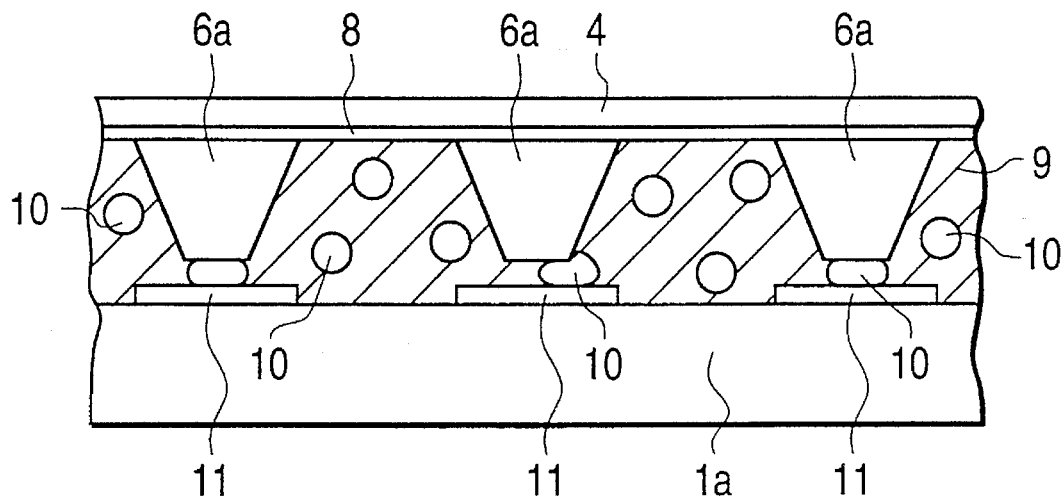
FIG. 3 is a diagram for explaining a conventional TAB connecting method for connecting terminal electrodes and pattern leads.

Seven embodiments of the present invention will be explained hereunder with reference to the accompanying drawings. The like reference numerals and symbols designate the like members or elements throughout the drawings.
First Embodiment:

FIG. 6 and FIG. 7 are perspective views for explaining a configuration of a pressure-connector terminal of the present invention.

Figure 6A:
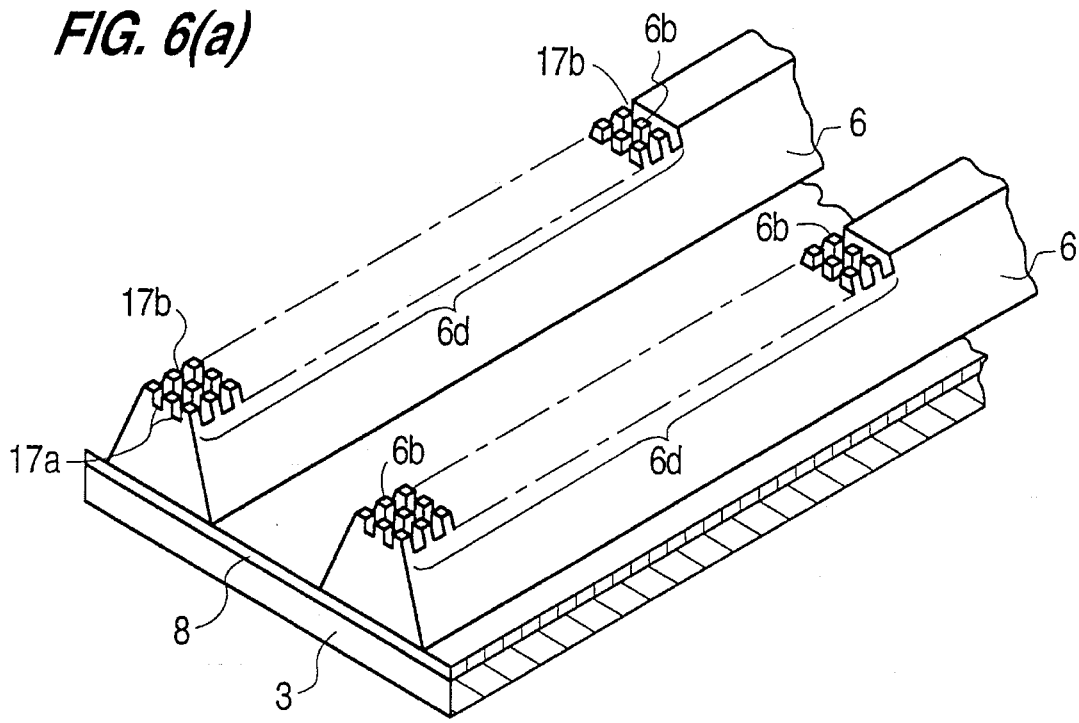
FIGS. 6(a)–6(c) show perspective views for explaining a configuration of a pressure-connector terminal in the present invention.

In FIG. 6(a), a pattern lead 6 (for example, made of copper) formed by the etching is attached on an insulating film 3 with a bonding material 8. The end part of pattern lead 6 is formed as a pressure-connector terminal 6d and the upper surface (connecting surface) of the pressure-connector terminal 6d is provided with a plurality of grooves 17a in the longitudinal direction of the pattern lead 6 and also provided with a plurality of grooves 17b in the width direction of the pattern lead 6. (In the figure, two grooves 17a and 17b are provided at both ends of the pressure-connector terminal 6d and the intermediate part is omitted.) The upper surface of the pressure-connector terminal 6d has the width of 5 to 10 μm) and the length of about 3 mm. The grooves 17a, 17b have the width of about 2 μm and depth of 1 to 2 μm. The divided connecting surface 6b is formed as a square in size of about 2 μm×2 μm.

Figure 6B:
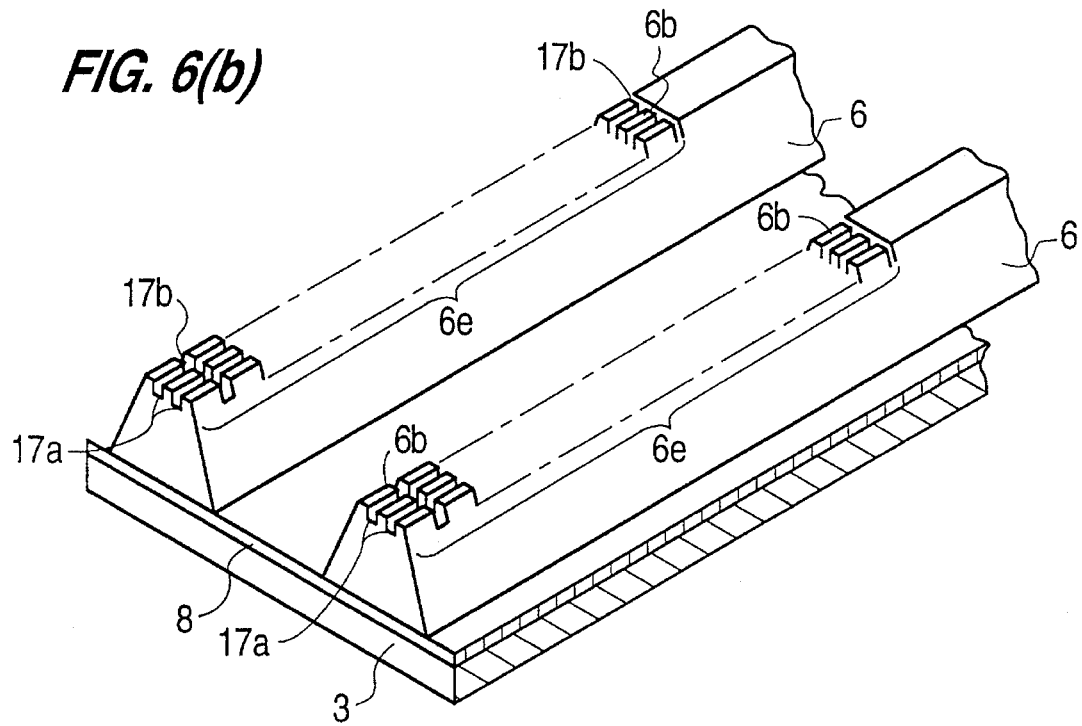

FIG. 6(b) is similar to FIG. 6(a), except for only difference that the divided connecting surface 6b is formed as a rectangular in size of about 2 μm×5 μm.

Figure 6C:
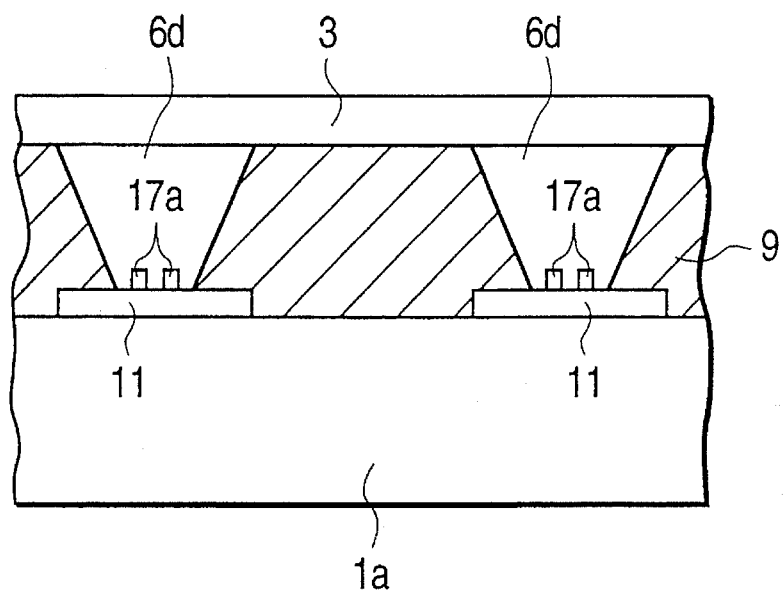

FIG. 6(c) is a sectional view for explaining a configuration of the junction of a pressure-connector terminal. In this figure, the divided connecting surfaces 6b of the pressure-connector terminal 6d (or pressure-connector terminal 6e) are connected with electrode terminals 11 formed on a glass substrate 1a provided opposed thereto.

Figure 7C:
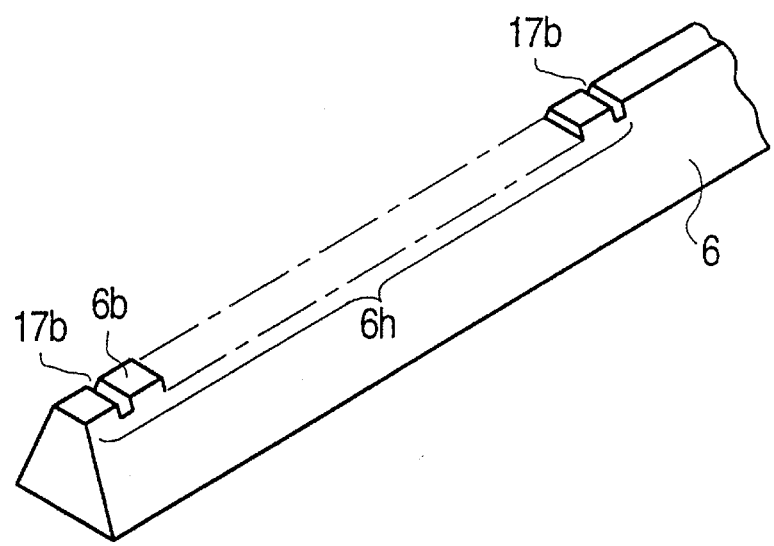
FIGS. 7(a)–7(c) show prospective views for explaining a configuration of a pressure-connector terminal in the present invention.
Figure 7A:
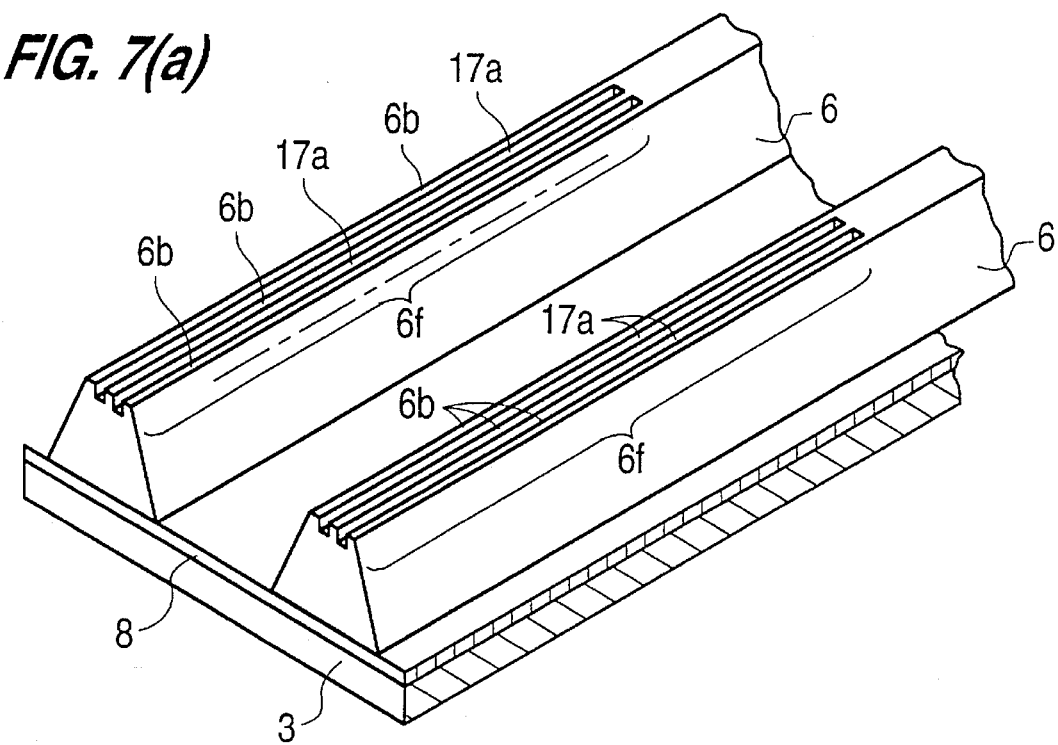

FIG. 7(a) shows a diagram illustrating pattern leads having only several grooves 17a. The length of grooves 17 is equal to the length of pressure-connector terminal 6f and a divided connecting surface 6b of the pressure-connector terminal 6f has the size of about 2 μm×3 μm.

Figure 7B:
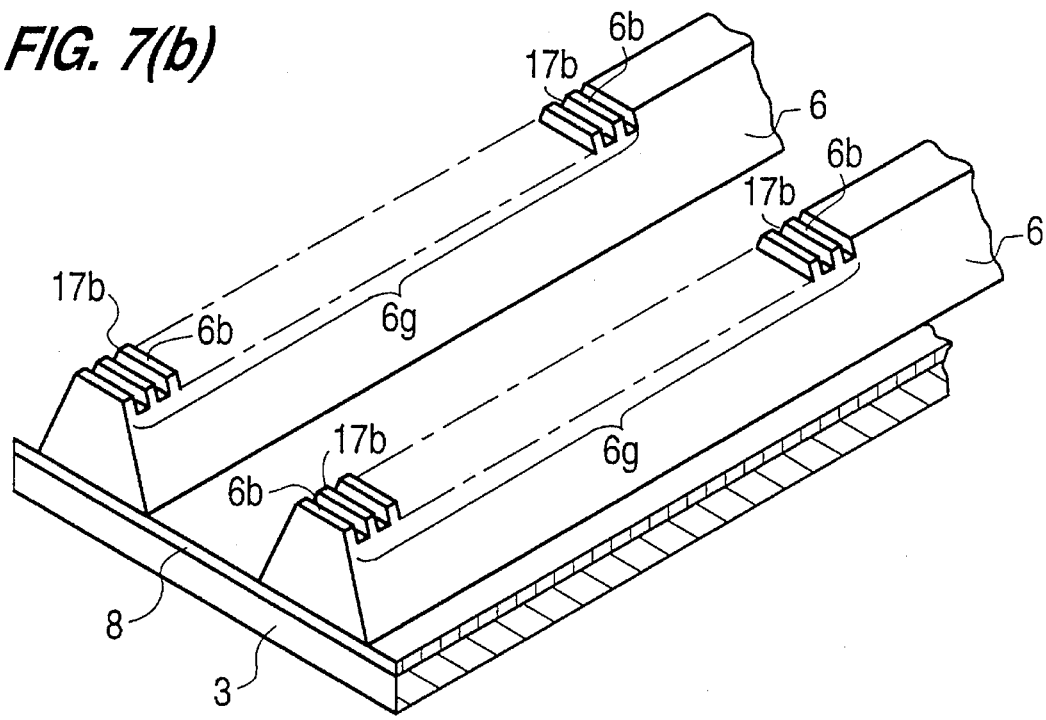

FIG. 7(b) shows a diagram illustrating pattern leads having only several grooves 17b. The divided connecting surface 6b of the pressure-connector terminal 6g has the size of about 2 μm× (5 to 10 μm).

FIG. 7(c) shows a profile of pattern lead where grooves 17b are provided in the width direction of the pressure-connector terminal 6h and thereby almost square divided connecting surfaces 6b are formed. This profile is applied when the width of upper surface of the pattern lead 6 is as small as about 3 μm.

Next, three kinds of manufacturing method for pressure-connector terminal will be respectively explained with reference to FIGS. 8, 9 and 10.

Figure 8A:
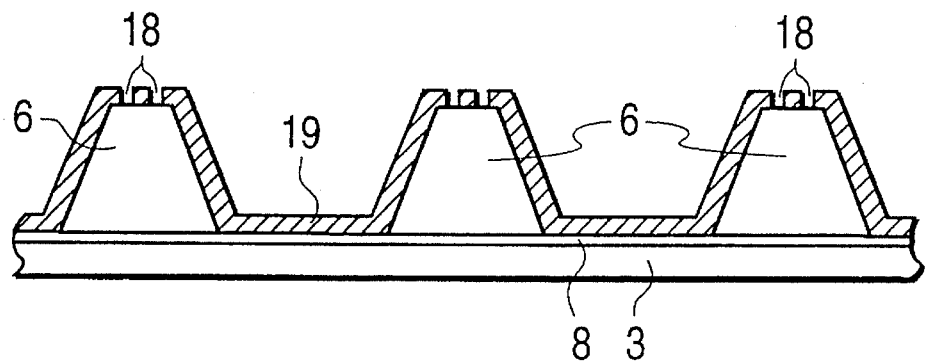
FIGS. 8(a)–8(c) show diagrams for explaining a method for manufacturing a pressure-connector terminal.
Figure 8B:
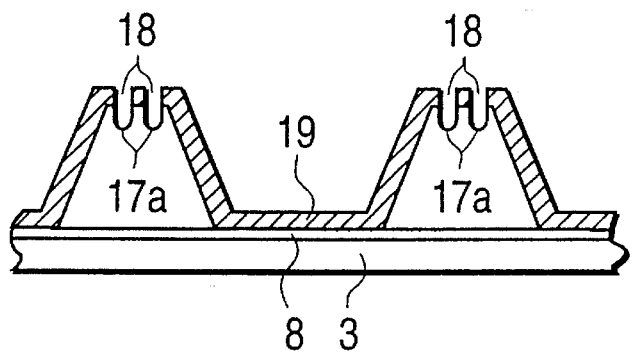
Figure 8C:
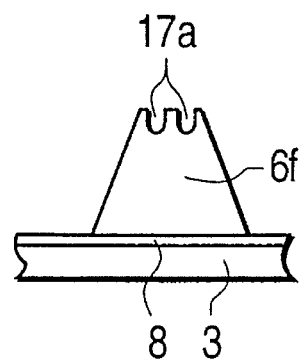

A first manufacturing method will be explained considering an example of a pressure-connector terminal 6f. As shown in FIG. 8(a), after formation, for example, of a copper foil pattern lead 6 attached on an insulating film 3 with a bonding material 8, a resist pattern 19 having apertures 18 to form grooves 17a of a pressure-connector terminal forming area is formed thereon. Subsequently, as shown in FIG. 8(b), grooves 17a are formed by the pattern etching. Depth of the grooves 17a is controlled depending on the etching time and it is set to about 2 μm in this embodiment. When the resist pattern 19 is removed, the pressure-connector terminal 6f having the grooves 17a can be completed as shown in FIG. 8(c). The pressure-connector terminals 6d, 6e, 6g, 6h can also be manufactured in the same manner as explained above and therefore the description thereof is not repeated here.

A second manufacturing method will be explained considering an example of a pressure-connector terminal 6f. As shown in FIG.9(a), after formation, for example, of a copper foil pattern lead 6 attached on an insulating film 3 with a bonding material 8, a nickel (Ni) layer 20 is formed on the pattern lead 6. Moreover, a resist pattern 19 having apertures 18 to form grooves 17a of the pressure-connector terminal forming area is formed thereon. Next, as shown in FIG. 9(b), the Ni layer 20 is selectively etched with the resist pattern 19. Thereafter, a pressure-connector terminal 6f having the grooves 17a can be completed as shown in FIG. 9(c) by removing the resist pattern 19. In this manufacturing method, since only the Ni layer 20 is selectively etched, the depth of grooves 17(a) becomes constant. Moreover, a metal layer other than nickel Ni may be used in place of the Ni layer 20, if it has selectivity of the etching for copper of the pattern lead 6. The pressure-connector terminals 6d, 6e, 6g, 6h can be manufactured in the same manner as described above and therefore the similar explanation is not repeated here.

A third manufacturing method will be explained taking an example of the pressure-connector terminal 6f into consideration. As shown in FIG. 10(a), after formation, for example, of a copper foil pattern lead 6 attached on an insulating film 3 with a bonding material 8, an insulating film 3 is fixed on a base 21 as shown in FIG. 10(b), a pressure die 22 having extrusions 23 formed corresponding to the grooves 17a of the pressure-connector terminal 6f is positioned to be provided opposed to the pressure-connector terminal 6f and it is pressed toward the pressure-connector terminal 6f to give plastic deformation thereto. Thereafter, the pressure-connector terminal 6f having the grooves 17a can be completed as shown in FIG. 10(c) by removing the pressure die 22. The pressure-connector terminals 6d, 6e, 6g can also be formed in the same manner as described above and the same description is not repeated here.

Next, a pressure-connector terminal connecting method will be explained hereunder.

FIG. 11 shows diagrams for explaining a pressure-connector terminal connecting method using a pressure-connector terminal shown in FIG. 6 and FIG. 7.

Figure 11A:
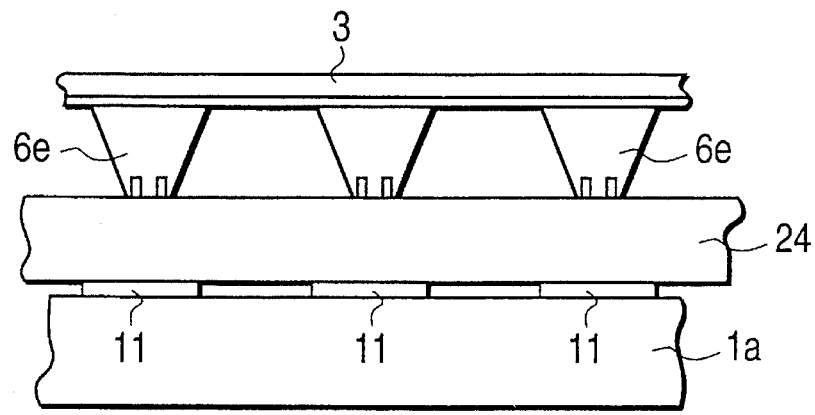
FIGS. 11(a)–11(c) show diagrams for explaining a method for connecting pressure-connector terminals using a pressure-connector terminal shown in FIGS. 6(a)–6(c) and FIGS. 7(a)–7(c)
Figure 11B:
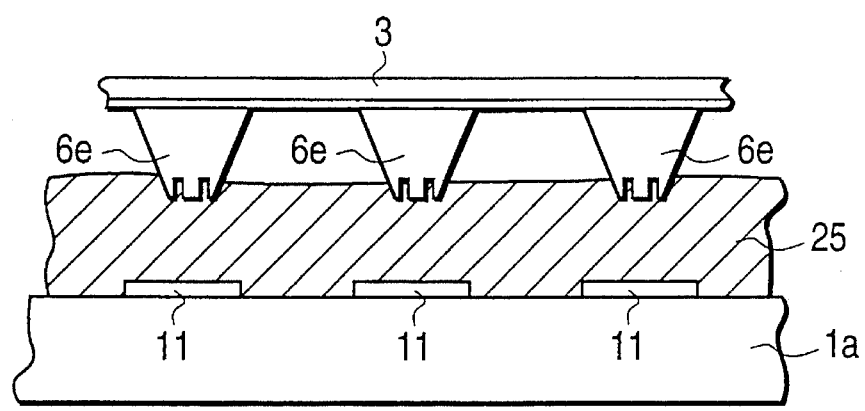

As shown in FIG. 11(a), pressure-connector terminals 6f formed on an insulating film 3 are provided opposed to terminal electrodes 11 formed on a glass substrate 1a via a bonding material sheet 24. The bonding material sheet 24 is formed of any one resin of the thermosetting resin or photosetting resin. This bonding material sheet 24 may be replaced, as shown in FIG. 11(b), with a thermosetting or photosetting fluid resin 25. In this case, the glass substrate 1a is coated with the fluid resin 25 covering the terminal electrodes 11. Thereafter, the pressure-connector terminals 6f are provided opposed to the terminal electrodes 11.

Figure 11C:
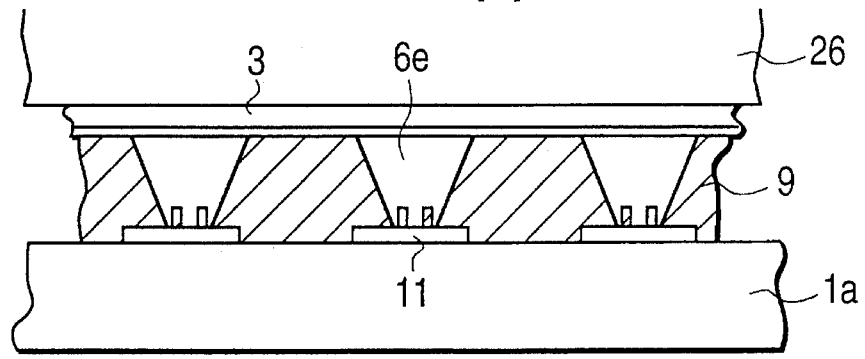

Next, as shown in FIG. 11(c), the insulating film 3 is pressed toward the glass substrate 1a using a pressurizing and heating head 26. In this case, pressure is set to about 30 kg/cm$^2$ and temperature is set to 180° C. As a result, the divided connecting surface 6b of the pressure-connector terminal 6f is joined with the terminal electrode 11 by removing the bonding material sheet 24 or fluid resin 25. Thereafter, when the thermosetting resin is heated up to the hardening temperature, it becomes the hardened bonding material 9 and the insulating film 3 and glass substrate 1a are bonded under the condition that the divided connecting surfaces 6b of the pressure-connector terminals 6f are connected with the terminal electrode 11. This connection is held by a contracting stress of the bonding material 9. Finally, connection between the pressure-connector terminal 6f and electrode terminal 11 can be completed by removing the pressurizing and heating head 26.

In above examples, the pressure-connector terminal 6f is considered, but the like connection for the pressure-connector terminals other than the terminal 6f can also be established.

Next, an example of providing a pressure-connector terminal in the side of glass substrate will be explained with reference to FIG. 12.

Figure 12A:
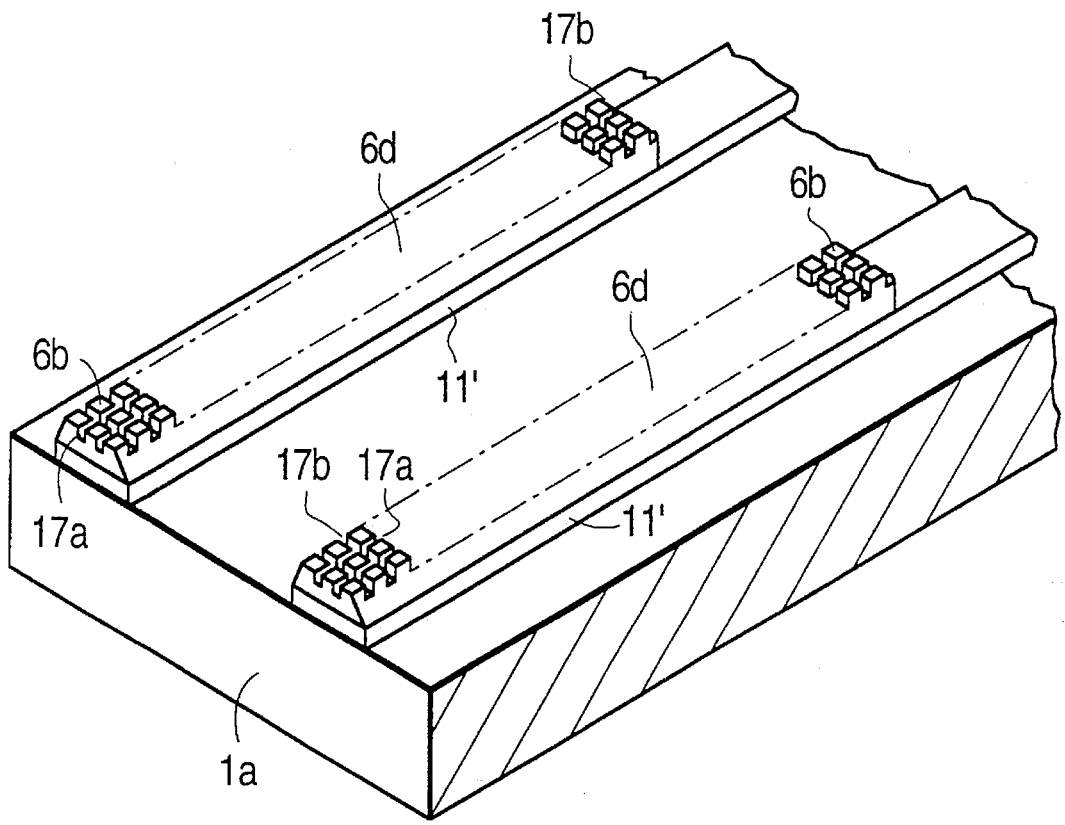
FIGS. 12(a) and 12(b) show diagrams for explaining an example of providing a pressure-connector terminal on a glass substrate.

FIG. 12(a) is a perspective view of a pressure-connector terminal 6d formed on a conductive pattern terminal 11' provided on a glass substrate 1(a). The pressure-connector terminals 6d may be formed by forming a conductive material layer consisting of gold Au or aluminum Al in the thickness of several μm on pattern lead terminals 11' and then providing thereon the grooves 17a and 7b.

Figure 12B:
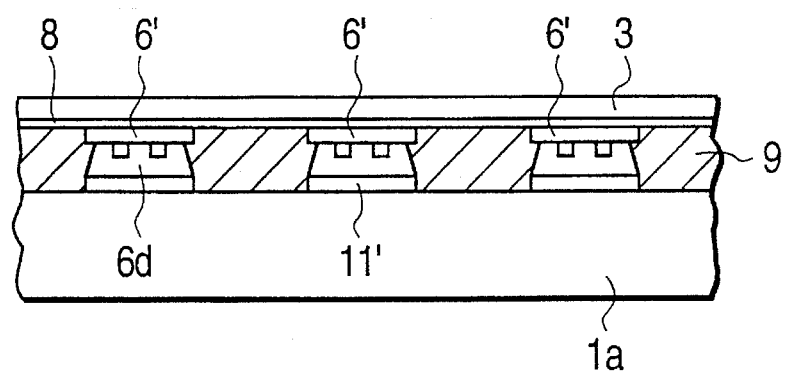

FIG. 12(b) is a diagram for explaining a connecting method of the pressure-connector terminal 6d. The conductor terminals 6' bonded on the insulating film 3 by the bonding material 8 are formed in the same pitch as the pressure-connector terminals 6d and are joined with the pressure-connector terminals provided opposed thereto. The connecting method of the pressure-connector terminals 6d is completed by the method same as that shown in FIG. 11.

In above examples, the pressure-connector terminal 6d is considered, but the like connection for the pressure-connector terminals other than the terminal 6d can also be established.

It goes without saying that the grooves 17a, 17b are not necessary to be provided in the longitudinal direction of the pattern lead and in the width direction of it, respectively, and to be perpendicular to each other.

FIG. 13 shows diagrams for explaining connection of COG (Chip On Glass) by the present invention.

Figure 13A:
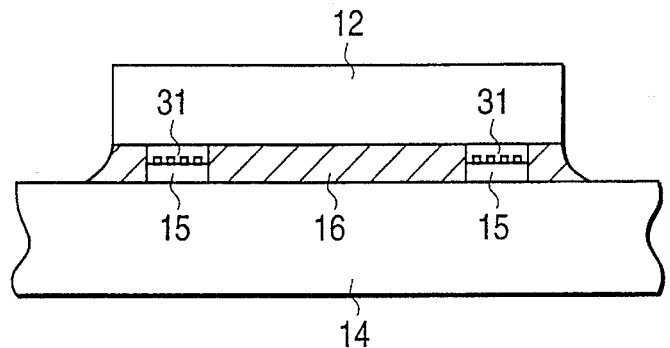
FIGS. 13(a)–13(c) show diagrams for explaining connection of COG (Chip On Glass) to which the present invention is applied.

FIG. 13(a) is a side elevation of COG connection. In this figure, pressure-connector terminals 31 in size of 50 μm×50 μm are formed at a lower surface (face) of a semiconductor chip 12, while terminal electrodes 15 are formed on a glass substrate 14 for connection with the pressure-connector terminals 31.

After the pressure-connector terminals 31 are connected with the conductor terminals provided opposed thereto, this connection is maintained with contraction stress of a bonding material 16 which is supplied between the semiconductor chip 12 and glass substrate 14 and is then hardened. Here, the bonding material is composed of a photosetting resin or thermosetting resin, or thermoplastic resin or a mixed resin of the thermosetting resin and thermoplastic resin.

Figure 4:
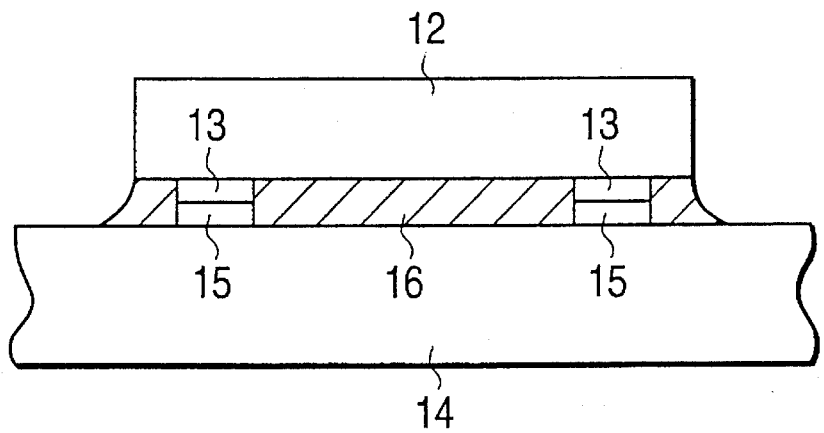
FIG. 4 is a diagram for explaining a conventional connecting method for connecting terminal electrodes and bumps for IC chips mounted on a substrate.
Figure 5A:
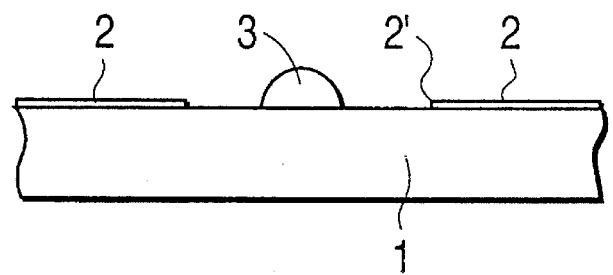
FIGS. 5(a)–5(c) show diagrams for explaining a conventional method for preventing entry of a bonding material into connecting portions of terminal electrodes and bumps for IC chips mounted on a substrate.
Figure 5B:
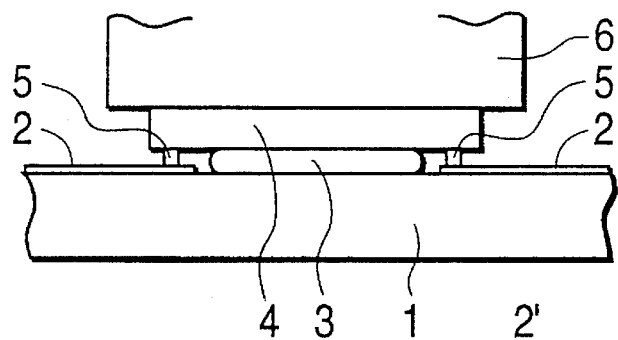
Figure 5C:
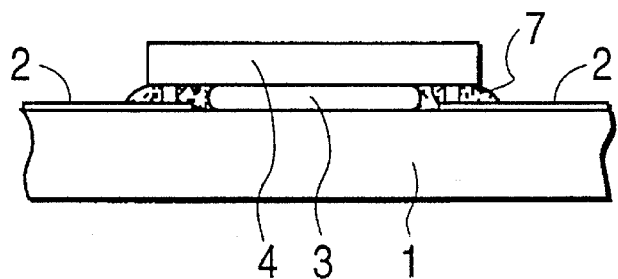
Figure 13B:
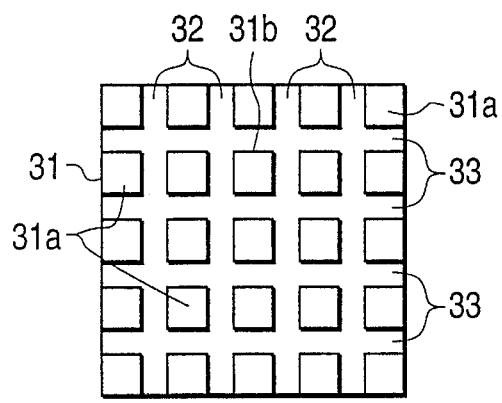
Figure 13C:
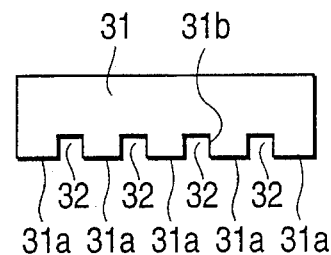

FIG. 13(b) is a plan view illustrating an enlarged view of lower surfaces (connecting surfaces) of a pressure-connector terminal 31 and FIG. 13(c) is a side elevation of the pressure-connector terminal 31. The pressure-connector terminals 31 are formed by providing a plurality of grooves 32 in the vertical direction and a plurality of grooves 33 in the lateral direction by the pattern etching method or mechanical processing method at the lower surface of a conventional bump 13 (FIG. 4) consisting of plated layer in the thickness of 10 to 20 μm. In this figure, a divided terminal 31b having four vertical grooves 32, four lateral grooves 33 and 25 divided connecting surfaces 31a is indicated. The grooves 32 and 33 have the width of about 2 μm and the depth of 1 to 5 μm. Each divided connecting surface 31a has the square or rectangular shape having a side of 2 to 10 μm.

The pressure-connector terminal 31 having 25 divided connecting surfaces 31a is connected with a connector terminal electrode 15 at the 10 to 25 areas.

FIG. 14 shows diagrams for explaining the other pressure-connector terminals for COG connection to which the present invention is applied.

Figure 14A:
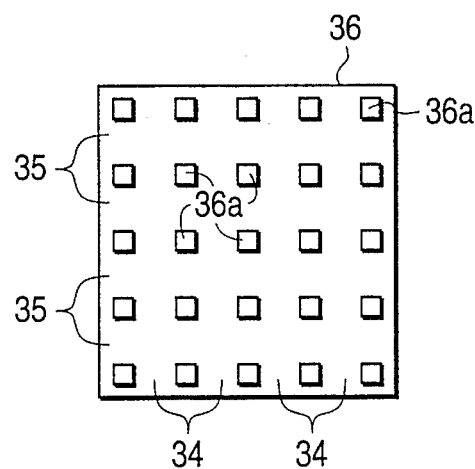
FIGS. 14(a)–(c) diagrams for explaining the other pressure-connector terminals for connecting COG to which the present invention is applied.

FIG. 14(a) is a plan view illustrating an enlarged lower surface (connecting surface) of a bump 36 (pressure-connector terminal) including a plurality of grooves 34 in the vertical direction, a plurality of grooves 35 in the lateral direction and divided connecting surfaces 36a.

Figure 14B:
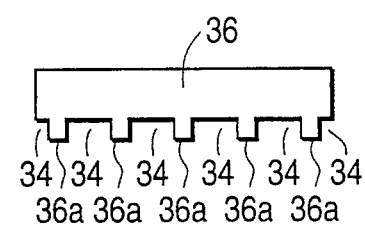

FIG. 14(b) is a side elevation of the bump 36.

Figure 14C:
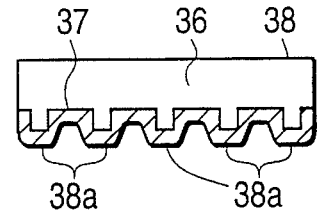

FIG. 14(c) is a side elevation of a pressure-connector terminal 38 where a Ni-plated layer 37, for example, is formed at the surface surface of the bump 36 shown in FIG. 14(b) and the divided connecting surface 36a is also covered with the Ni-plated layer 37. Since the divided connecting surface 36a of such pressure-connector terminal 38 has the protruded surface, when it is connected with an opposite conductor terminal, the end part of protruded surface easily generates plastic deformation. Thereby, contact area for the conductor terminal electrode 15 becomes larger than that of the divided connecting surface 36a having the flat surface.

Figure 15:
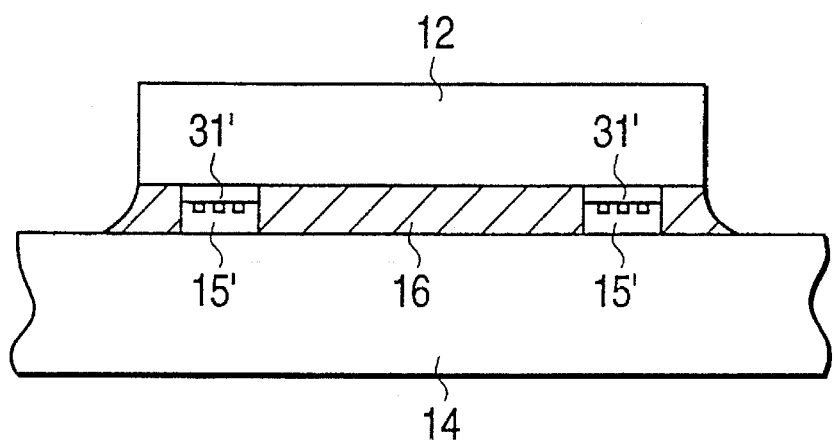
FIG. 15 is a diagram for explaining COG connection to form pressure-connector terminals on a glass substrate.

FIG. 15 is a diagram for explaining COG connection where a pressure-connector terminal is formed on a glass substrate. In this figure, a pressure-connector terminal 15' formed on a glass substrate 14 is provided with a plurality of grooves and thereby a plurality of divided connecting surfaces are formed. The divided connecting surfaces are in contact with a bump 31', maintaining its electrical connection with a contraction stress of the hardened bonding material 16. Here, the bonding material is composed of a photosetting resin or thermosetting resin, or thermoplastic resin or a mixed resin of the thermosetting resin and thermoplastic resin.

Second Embodiment:

This embodiment relates to a connecting method not allowing existence of residual bonding material between a bump of IC chip and a terminal electrode.

FIG. 16 shows diagrams for explaining a connecting method not allowing formation of a bonding material film between a bump of IC chip and a terminal electrode of a substrate.

Figure 16A:
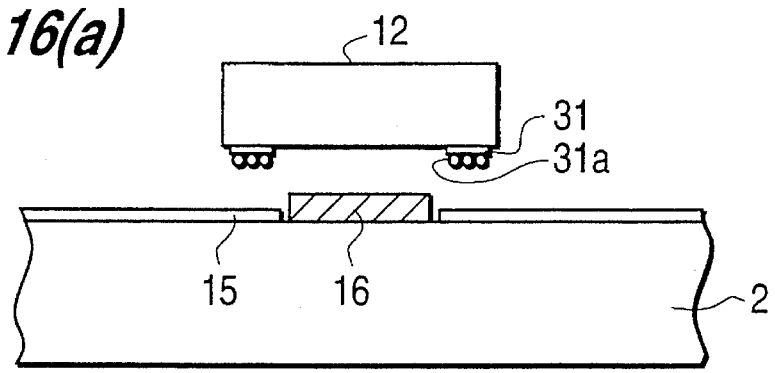
FIGS. 16(a)–16(d) show diagrams for explaining a connecting method not allowing formation of a bonding material film between bumps of IC chips and terminal electrodes.

As shown in FIG. 16(a), a region, for example, surrounded by a terminal electrode 15 on a printed wiring board 2 is covered with a bonding material 16, avoiding the terminal electrode 15. This bonding material 16 is supplied as a fluid material or a sheet material formed by a photosetting resin or thermosetting resin or thermoplastic resin or a mixed resin of the thermosetting resin and the thermoplastic resin. A bump 31 of the IC chip 12 is formed, for example, by a gold (Au)-plated layer in the thickness of 10 to 20 μm. The connecting surface of the bump 31 is provided with the grooves 32, 33 similar to those described for the first embodiment to form a plurality of divided connecting surfaces 31a. Depth of the grooves 32, 33 is 5 to 10 μm.

Figure 16B:
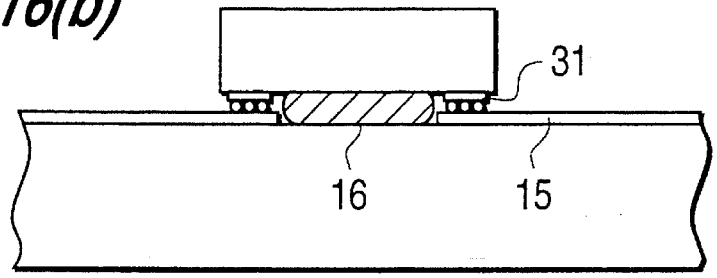
Figure 16C:
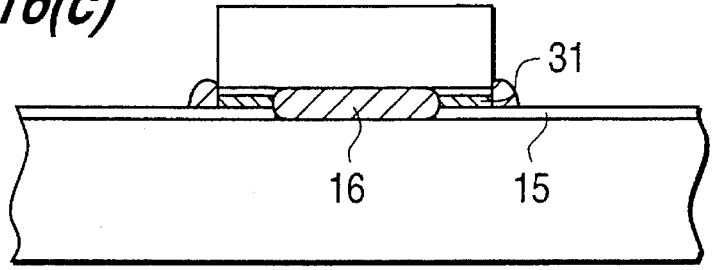

In the example of FIG. 16(a), the bonding material 16 is provided on the printed wiring board 2, but it may also be provided at the lower surface of the IC chip 12. In this case, the area surrounded by a bump 31 is covered with the bonding material 16, avoiding the bump As shown in FIG. 16(b), a divided connecting surface is pressed toward an opposed terminal electrode 15 and when the divided connecting surface is in contact with the terminal electrode 15, the bonding material 16 spreads, arriving at the terminal electrode 15, not covering it. Next, as shown in FIG. 16(c), the bump 31 is positioned at the terminal electrode 15 and the IC chip 12 is pressed for 20 seconds with the pressure of 15 kg/cm². Thereby, the divided terminal 31b is crushed and the bonding material 16 further spreads beyond a connecting area of the bump 31 and terminal electrode 15. In the case the bonding material 16 is prepared as the sheet condition, the optimum width b of the sheet is determined by the equation, $b=ah_o/h$, where h is thickness of sheet, a is distance between bumps and $h_o$ is height of bump.

Figure 16D:
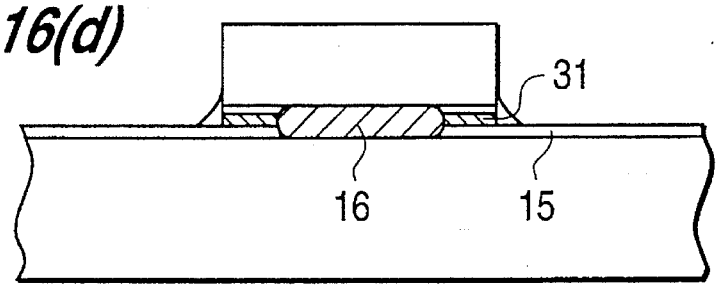

Thereafter, as shown in FIG. 16(d), the connecting areas between the divided connecting surface 31a and terminal electrode 15 are automatically covered with the bonding material by heating the bonding material up to about 180° C. for hardening it.

As described above, the method of this embodiment is different from the Japanese Patent Laid-Open No. 62-132331 in such a point as including the process of spreading the bonding material in two steps. As a result, the bonding material spreads to the entire part of the IC chip and it does not generate nonuniform residual stress even when it is hardened.

Figure 17:
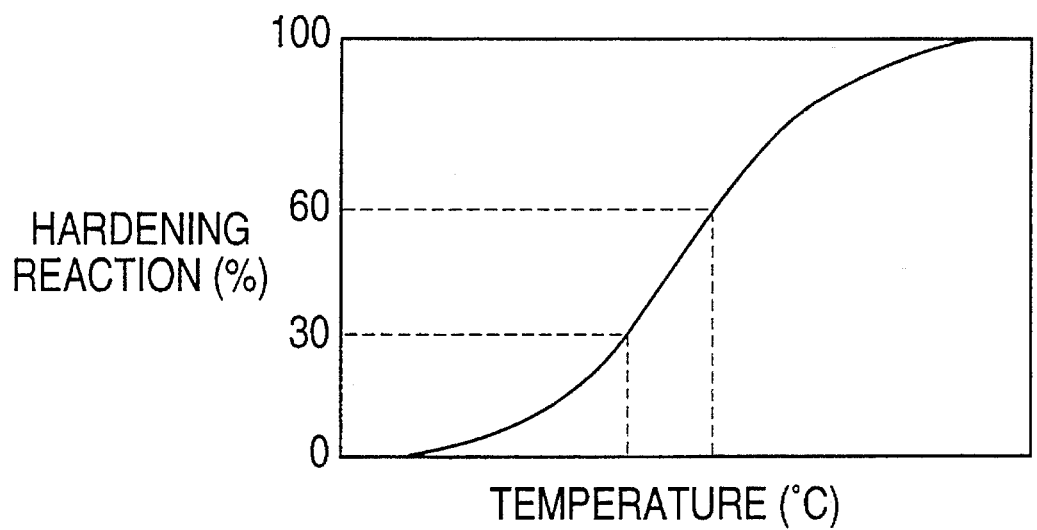
FIG. 17 is a graph for indicating relationship between a hardening reaction rate of a bonding material used in the present invention and heating temperature.

FIG. 17 is a graph indicating relationship between a hardening reaction rate of a bonding material used in the present invention and heating temperature. As can be understood from this graph, when the bonding material is heated up to about 140° C. (range shown by broken lines ), hardening thereof proceeds by 30 to 60% and it is perfectly hardened at the heating temperature of about 180° C. (the right end of the abscissa).

Figure 18:
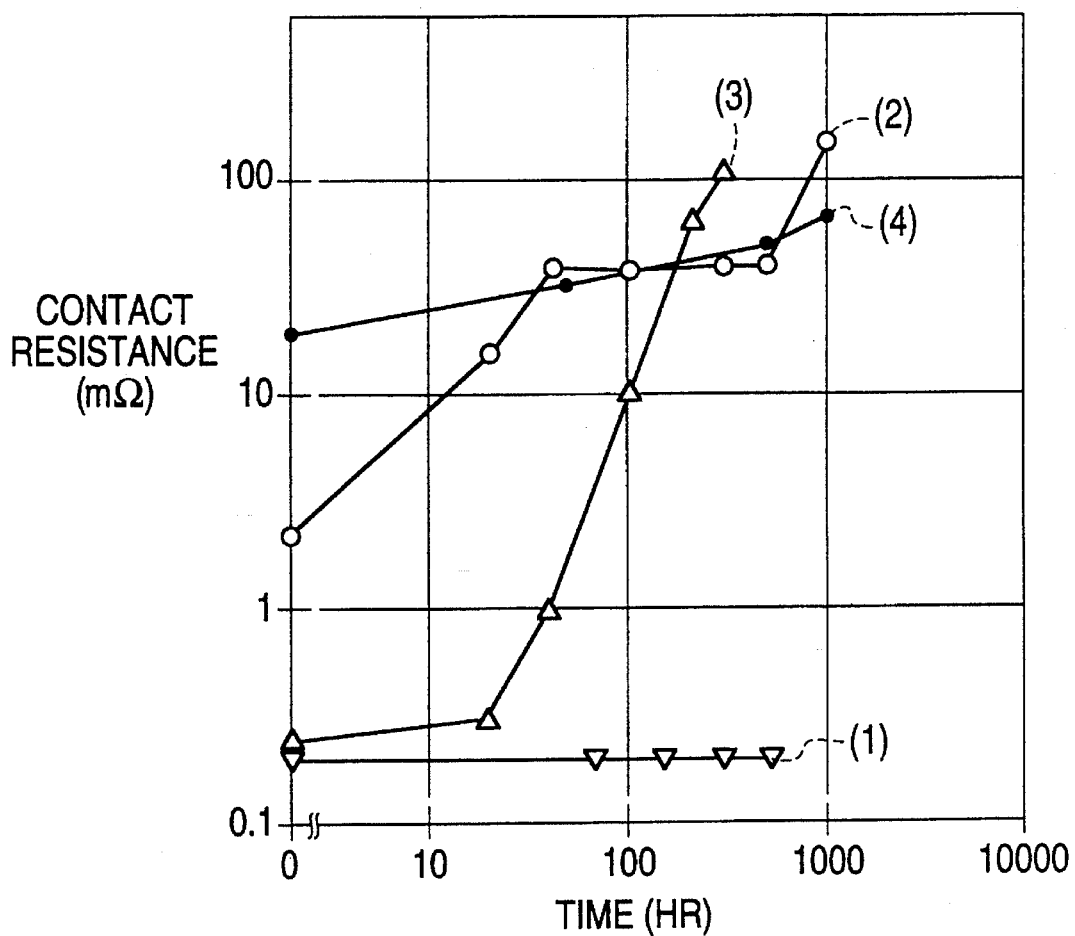
FIG. 18 is a graph indicating aging characteristic of a contact resistance at connecting areas obtained by the connecting method of the embodiment of the present invention.

FIG. 18 is a graph indicating degradation with passage of time for contact resistance at the connecting areas obtained by the connecting method of this embodiment. In this graph, a curve (1) shows variation of contact resistance measured under the condition that the connecting areas are left in the environment with temperature of 85° C. and humidity of 85%. For the comparison purpose, a curve (2) shows variation of contact resistance in the pressure-connection of COG in the prior art, a curve (3) corresponds to that of the pressure connection in the same configuration as that disclosed in the Japanese Patent Laid-Open No. 62-132331 using the same bonding material as that in this embodiment and a curve (4) shows that in the pressure-connection of TAB using ACF. The COG connection (curve (1)) of the present invention not only results in a small contact resistance value but also shows little change of the value for the period of 400 hours. On the contrary, the curve (3) shows sudden increase of contact resistance after 20 hours. An estimated cause is that contact areas of connecting regions are reduced due to gradual release of internal stress after the bonding material provided only at the central region of the chip is hardened.

In the mounting method of the prior art, the pressure-contact terminals are pressed toward the terminal electrode provided opposed thereto and the bonding material is hardened without confirming the connecting condition.

Therefore, when the terminals are heated up to about 140° C. under the condition that the divided connecting surfaces 31a of the devided termial 31b are pressed toward the terminal electrode 15 and are in contact therewith as shown in FIG. 16(b), the bonding material 16 is hardened by 30 to 60% and are temporarily fixed while the divided terminal 31b is in contact with the terminal electrode 15. Under this condition, a voltage is applied to the IC chip 12 via a printed wiring board 2 and thereby the connecting condition of the bump 31 and terminal electrode 15 can be checked. With this check, not only the connection of bump 31 and terminal electrode 15 but also normal or irregular condition of the IC chip characteristics can be checked. As a result, a defective IC chip can be replaced with a new IC chip.

Third Embodiment:

This embodiment relates to another method for inspecting connecting condition of bumps and terminal electrodes in the course of COG mounting.

Defective connection between bumps and terminal electrodes is often caused by short-circuit between adjacent bumps due to excessive crush or poor contact of bumps due to insufficient application of pressure.

Figure 19A:
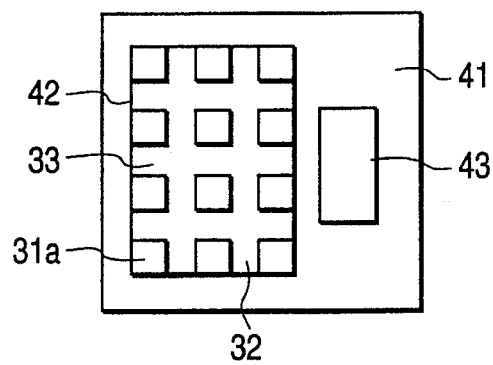
FIGS. 19(a)–19(c) show diagrams for explaining the principle of the method of this embodiment.
Figure 19B:
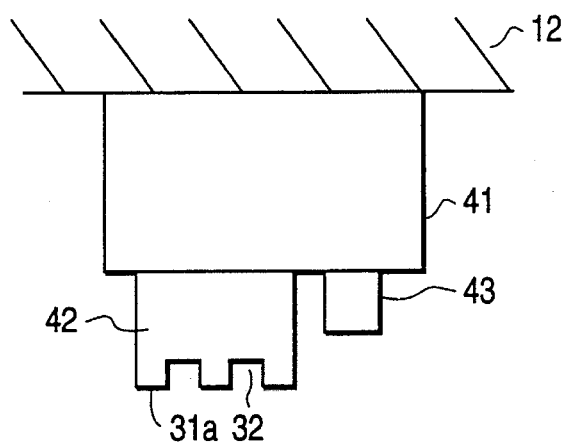

FIG. 19 shows diagrams for explaining the principle of this embodiment. First, a main bump 42 (for example, section 100 μm×120 μm; height 10 μm) and an auxiliary bump 43 (for example, section 50 μm×25 μm; height 5 μm) are provided on an original bump 41(for example, section 120 μm×120 μm; height 10 μm). FIG. 19(a) is a plan view and FIG. 19(b) is an elevational view. FIG. 19(a) shows an example which a pressure connector terminal 31 ( FIG. 13(b) ) is provided on the main bump 42. These main bump 42 and auxiliary bump 43 are generally manufactured by transcription method. In the formation of bump with the transcription method, a lower auxiliary bump 43 is transcribed first and a higher main bump 42 is thereafter transcribed.

Figure 19C:
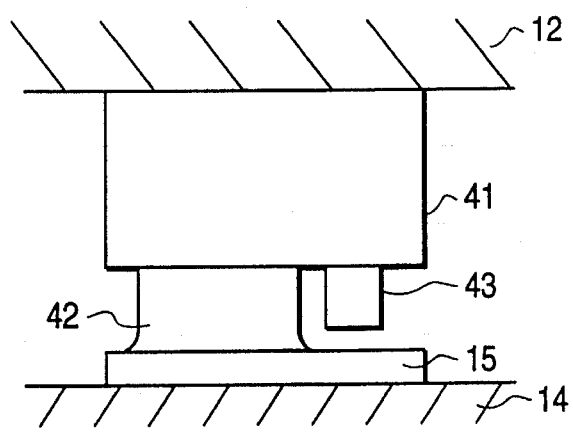

FIG. 19(c) is an elevational view indicating the condition that a bump 41 is connected with a terminal electrode 15 formed on a glass substrate 14. When the bump 41 is connected with pressure to the terminal electrode 15, if adequate crush of main bump 42 is assumed as about 3 μm, distance between the auxiliary bump 43 and terminal electrode 15 becomes about 2 μm. Therefore, when distance between the auxiliary bump 43 and terminal electrode 15 measured for all bumps 41 with a laser microscope, etc. is about 2 μm, connection of such bump 41 can be considered as normal connection.

FIG. 20 shows diagrams for explaining connection of a square bump providing elliptic main bump and auxiliary bump and a terminal electrode.

Figure 20A:
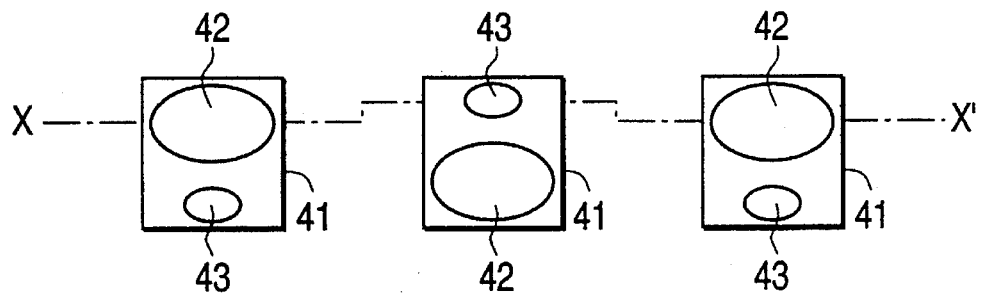
FIGS. 20(a)–20(b) show diagrams for explaining an example of connecting square bumps providing elliptic main bumps and auxiliary bumps to terminal electrodes.
Figure 20B:
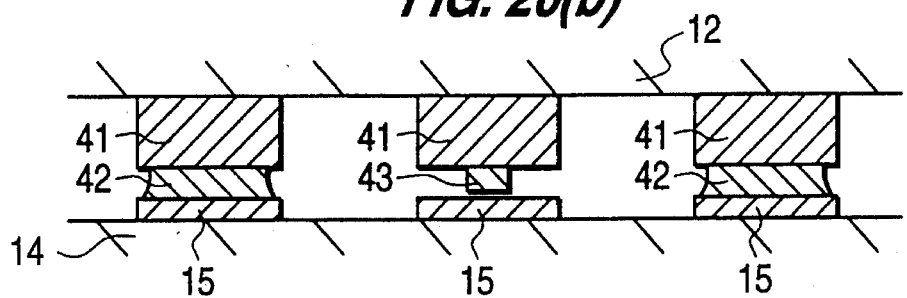

FIG. 20(a) is a plan view and FIG. 20(b) is a sectional view taken along the line X–X'. As shown in FIG. 20(a), a main bump 42 having a longer diameter of 100 μm, a shorter diameter of 60 μm and height of 10 μm and an auxiliary bump 43 having a longer diameter of 40 μm, a shorter diameter of 25 μm and height of 5 μm are formed on a bump 41 consisting of gold (Au) and having a square section with a side of 120 μm and height of 10 μm. The main bump 22 and auxiliary bump 23 in the adjacent bumps are arranged oppositely. Such arrangement never generates short-circuit between neighboring bumps even if the bumps are crushed excessively in the connection between bumps 41 and terminal electrodes 15.

Next, a bump 41 is aligned with a terminal electrode 15 and pressure of 10kg/cm$^2$ is applied thereto for 20 seconds while the IC chip 12 is heated to 200° C. As shown in FIG. 20(b), a part of the main bump 42 is crushed and deformed. Distance between an auxiliary bump 43 and a terminal electrode 15 is measured for respective bump 41 using a laser microscope. The result is 1 to 2 μm, indicating that connection between the bump 41 and terminal electrode 15 is normal.

Figure 21A:
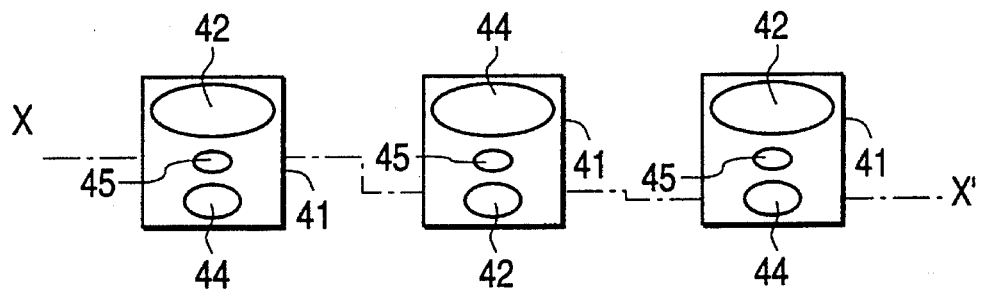
FIGS. 21(a)–21(b) show diagrams for explaining an example of connecting square bumps providing elliptic main bumps and first and second auxiliary bumps.
Figure 21B:
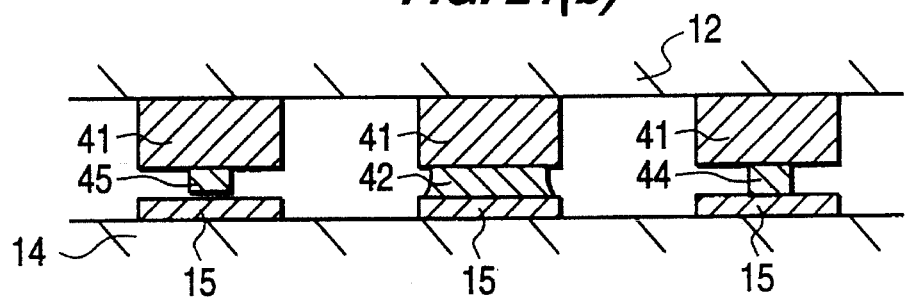
Figure 23A:
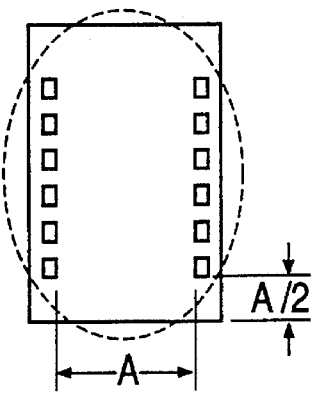
FIGS. 23(a)–23(g) show for indicating an IC chip having a new arrangement of bump used in an embodiment of the present invention.
Figure 23B:
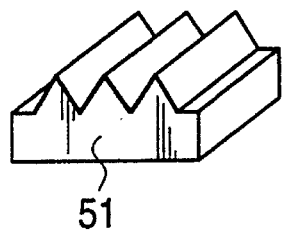
Figure 23C:
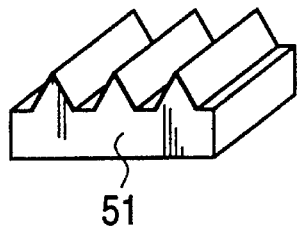
Figure 23D:
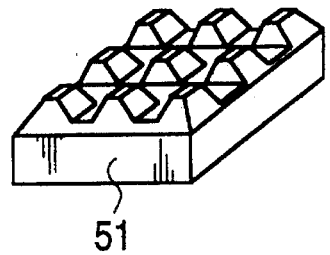
Figure 23E:
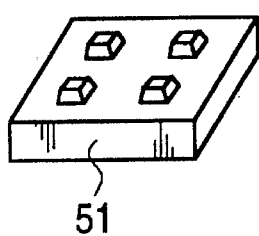
Figure 23F:
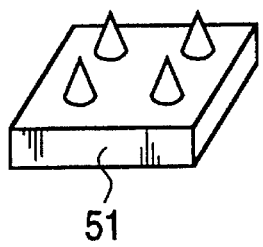
Figure 23G:
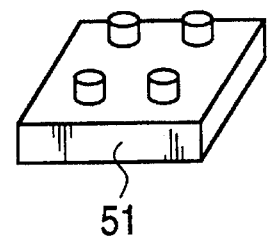

FIG. 21 shows diagrams for explaining connection between a square bump comprising an elliptic main bump and first and second auxiliary bumps and a terminal electrode. FIG. 21(a) is a plan view indicating such connection and FIG. 21(b) is a sectional view taken along a line X–X'.

As shown in FIG. 21(a), a second auxiliary bump 45 consisting of gold (Au) and having a longer diameter of 35 μm, a shorter diameter of 10 μm and height of 5 μm is formed on a bump 41 consisting of gold Au and having a square section with a side of 120 μm and height of 10 μm. Thereafter, a first auxiliary bump 44 consisting of copper (Cu) and having a longer diameter of 50 μm, a shorter diameter of 35 μm and height of 7 μm is formed and finally a main bump 42 consisting of gold (Au) and having a longer diameter of 100 μm, a shorter diameter of 40 μm and height of 10 μm is also formed.

Next, a bump 41 is aligned with a terminal electrode 15 and pressure of 10kg/cm$^2$ is applied thereto for 20 seconds while the IC chip is heated to 200° C. As shown in FIG. 21(b), the first bump 44 is just in contact with the terminal electrode 15 and the main bump 42 is crushed in the size of 3 μm and is in contact with the terminal electrode 12. The first auxiliary bump 44 also has a role of stopper. Measurement with a laser microscope enables that distance between the second auxiliary bump 45 and the terminal electrode 15 can be confirmed as 1 to 2 μm for respective bumps 41 and connection between the bump 41 and terminal electrode 15 can be recognized as normal.

Fourth Embodiment:

As described in the first, second and third embodiments, in the process of establishing pressure terminal connection, a bonding material provided at a part of the IC chip is spread to the entire part thereof by pressing the IC chip toward the substrate by applying pressure thereto to deform (crush) the bump. However, since this pressure generates distortion of mounting, it is preferable that this pressure is possibly minimized from the viewpoint of reliability of connection.

This embodiment shows an example that the bonding material can be spread to the almost entire part of IC chip covering all bumps only by deforming the bump for 2 μm, while the bonding material cannot be spread, in the prior art, to the entire part of the IC chip covering all bumps until the bump is deformed by 5 to 6 μm.

FIG. 22 shows diagrams for explaining a profile where the bonding material spreads when pressure is applied to the IC chip.

FIG. 22(a) includes a plan view and an elevational view, where the bumps 51 of IC chip 12 are in contact with the terminal electrode 15 of a substrate 14 interposing the bonding material 16.

FIG. 22(b) includes a plan view and an elevational view, where the IC chip 12 is pressed until the bump 51 is crushed by 2 μm. In this case, the bonding material 16 spreads in the hatched area. Therefore, the bonding material 16 does not spread to the four corners of the IC chip 12. A couple of bumps 51 at the corners are not covered by the bonding material 16.

FIG. 22(c) includes a plan view and an elevational view, where the IC chip 12 is further pressed until the bump 51 is crushed by 4 to 5 μm. In this case, the bonding material 16 spreads in the hatched area. As shown in this figure, the bonding material 16 spreads in the entire part of the IC chip 12.

FIG. 23 illustrates several kinds of configuration of pressure-connector terminal and an IC chip having a new arrangement of bumps used in this embodiment. As shown in this FIG. 23(a), when distance between the lines of bumps parallel to a pair of opposed sides of a rectangular is defined as A, the bumps are arranged only in the area displaced by A/2 from another pair of opposed sides of the IC chip. A broken line indicates the circumference of the region where the bonding material spreads covering all bumps. Thereby, equivalent spread of bonding material 16 as shown in FIG. 22(c) can be obtained only with pressure shown in FIG. 22(b).

FIG. 23(b)–(g) are perspective views for another various configurations of the pressure connector terminal formed on an upper surface of a bump. These pressure connector terminals are formed by pressing the upper surface of the bumps by a pressure die. The pressure connector terminals shown in FIG. 23(e),(f), and (g) are also formed as one body with the bump 51.

Fifth Embodiment:

This embodiment relates to a pressure-connector terminal having a configuration where any residual bonding material does not exist at the connecting surface of an outer pattern lead pressure-connector terminal of a pattern lead in a TAB and a terminal electrode and a method for connection thereof in the TAB connection.

FIG. 24 shows diagrams for explaining a connecting method of a pressure-connector terminal in which bonding material attaching grooves are provided over pattern leads.

Figure 24A:
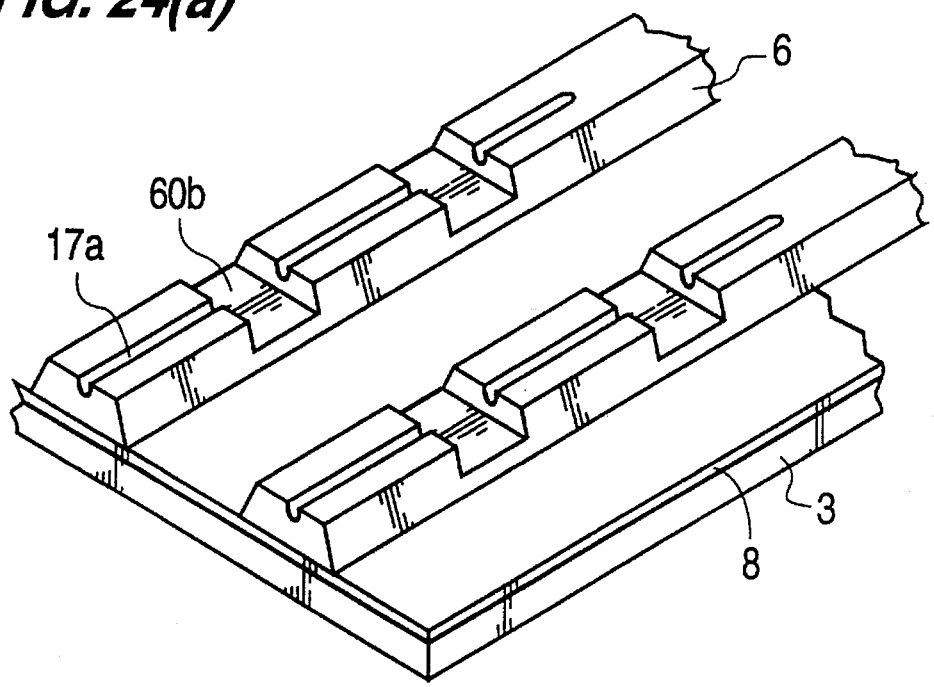
FIGS. 24(a)–24(c) show diagrams for explaining a connecting method of a pressure-connector terminal providing bonding material attaching grooves to a pattern lead.

As shown in FIG. 24(a), the grooves 17a in the longitudinal direction and the bonding material attaching grooves 60b in the direction transverse to the former grooves 17a are formed on the pattern leads 6. Depth of the bonding material attaching groove 60b is smaller than thickness of the pattern leads 6.

Figure 24B:
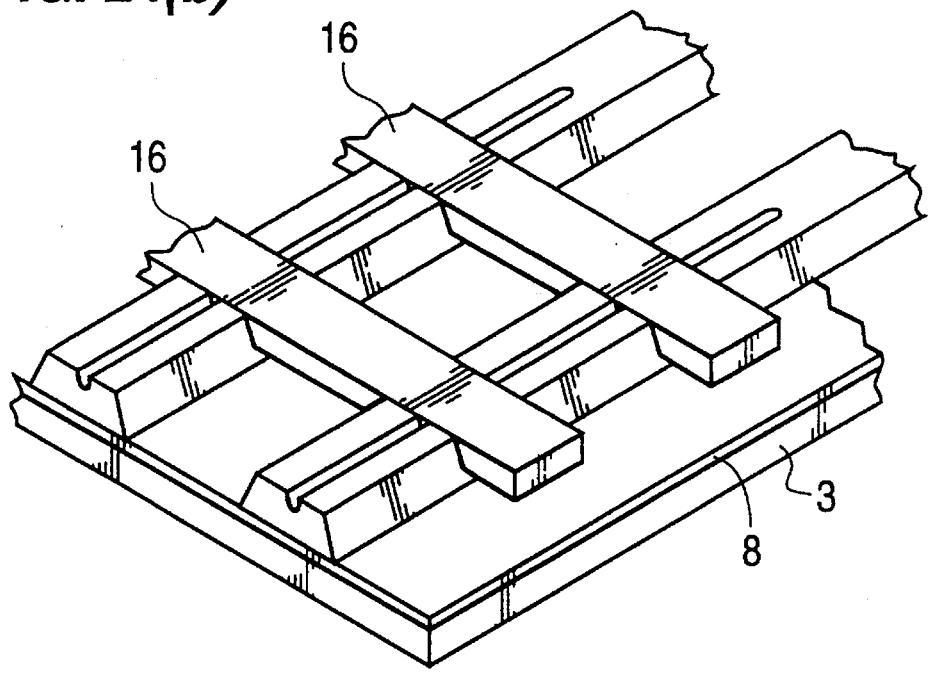

As shown in FIG. 24(b), after the bonding material 16 is attached to the bonding material attaching grooves 60b, the pattern lead pressure-connector terminals are aligned with the terminal electrodes (not illustrated) of a substrate and heat and pressure are then applied as in the case of the first embodiment.

Figure 24C:
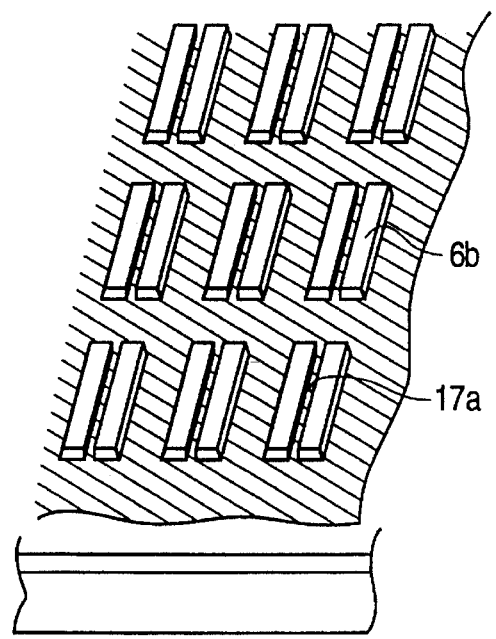

As a result, as shown hatched area in FIG. 24(c), the bonding material 16 occupies the regions between pattern leads 6, grooves 17a and the groove 60b and never exists at the connecting surfaces 6b of the pattern lead pressure-connector terminals and terminal electrodes of substrate.

FIG. 25 shows diagrams for explaining a connecting method of a pressure-connector terminal providing a bank consisting of an insulator at the position on the insulating film separated by a constant distant from the end face of the pattern lead and in the direction transverse thereto.

Figure 25A:
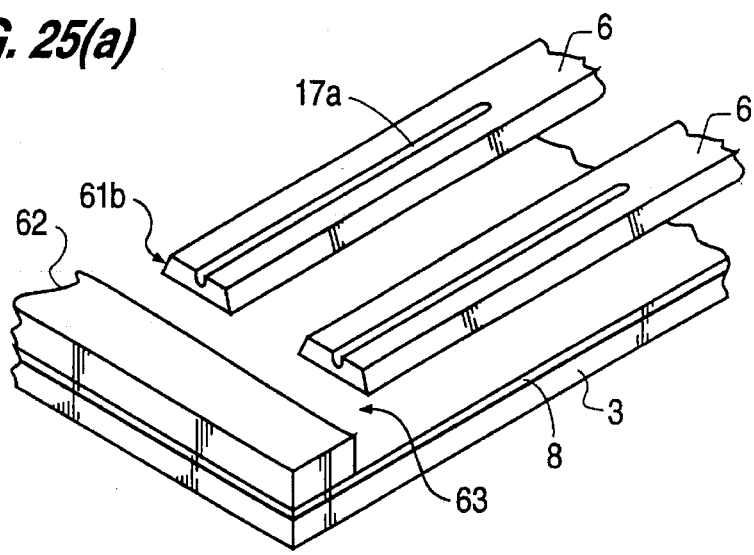
FIGS. 25(a)–25(b) show diagrams for explaining a connecting method of a pressure-connector terminal providing banks consisting of an insulating material in the vertical direction for a pattern lead keeping a constant distance from the end surface of the pattern lead on the insulating film.

As shown in FIG. 25(a), a groove 17a is formed on a pattern lead 6 in its longitudinal direction and a bank 62, which is separated by a constant distance from the end face 61b of the pattern lead and is higher than at least the pattern lead, is also formed in the direction transverse to the pattern lead 6. Thereby, the end face 61b of pattern lead and the bank 62 form a bonding material attaching groove 63.

Figure 25B:
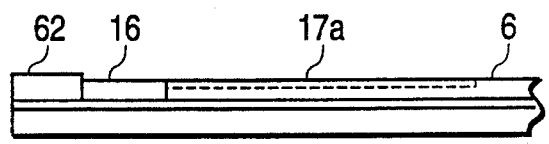

Next, as shown in FIG. 25(b), after the bonding material 16 is attached to the bonding material attaching groove 63, the pressure-connector terminals of pattern leads are aligned with the terminal electrodes (not illustrated) and pressure and heat are applied thereto like the first embodiment. Thereby, the softened bonding material 16 fills the region between the pattern leads 6, the groove 17a and the groove 63 and does not enter the connecting surface between the pressure-connector terminals of pattern leads and terminal electrodes of the substrate.

FIG. 26 are diagrams for explaining a connecting method of a pressure-connector terminal providing a bonding material which is just aligned with an area defined between pattern leads.

Figure 26A:
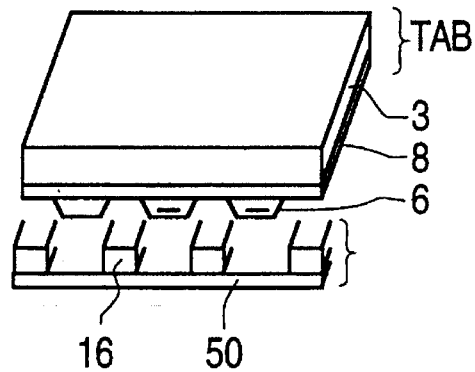
FIGS. 26(a)–26(c) show diagrams for explaining a connecting method of a pressure-connector terminal providing a bonding material just aligned between the pattern leads.

As shown in FIG. 26(a), the bonding materials 16 are provided on a protection film 50 in alignment with pitch of the pattern leads 6. The pattern lead 6 is provided with the grooves 17b (FIG. 26(c)) transverse to the longitudinal direction thereof.

Figure 26B:
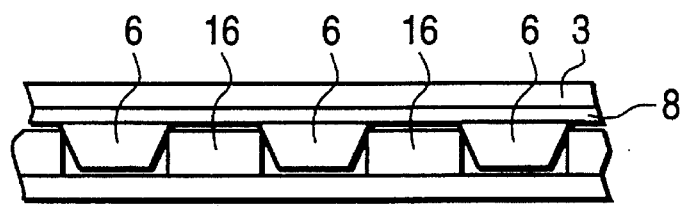

Moreover, the region defined between the pattern leads 6 is filled with the bonding material 16 as shown in FIG. 26(b). The pressure-connector terminals of pattern leads are aligned with the terminal electrodes of a substrate and then heat and pressure are applied thereto like the first embodiment.

Figure 26C:
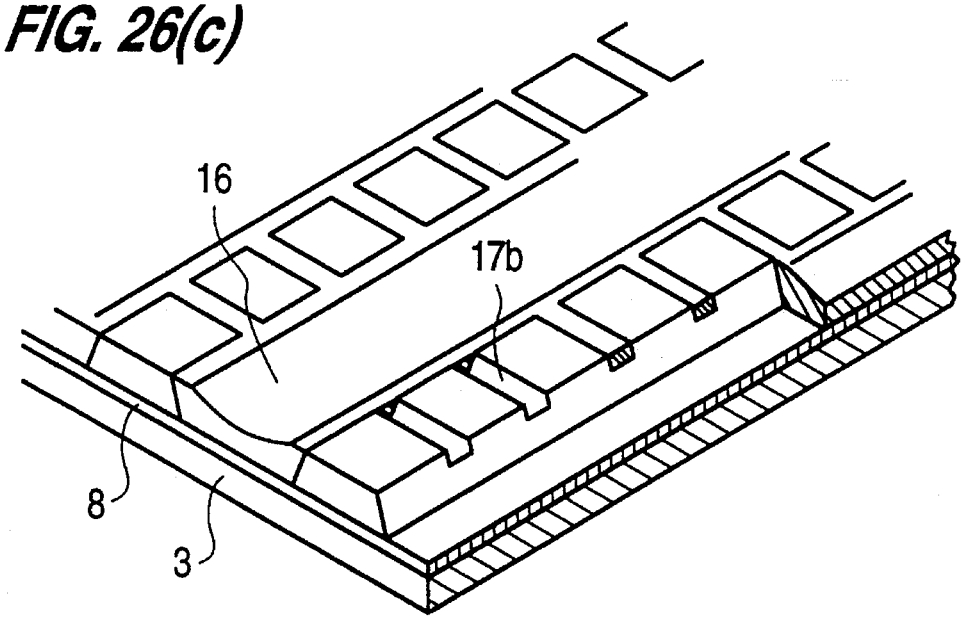

As a result, as shown in FIG. 26(c), the softened bonding material 16 fills the region defined between the pattern lead 6 and the groove 17b and does not enter the connecting surfaces of the pressure-connector terminals of pattern leads and terminal electrodes of a substrate.

In this figure, the grooves 17b are formed transverse to the longitudinal direction of the pattern lead 6, but the grooves are not always required to be formed transverse to the longitudinal direction of the pattern lead 6.

Sixth Embodiment:

This embodiment also relates to a pressure-connector terminal having a configuration where any residual bonding material does not exist at the connecting surface of a pattern lead pressure-connector terminal of TAB and a terminal electrode and a method for connection thereof in the TAB connection.

FIG. 27 are diagrams for explaining a connecting method of pressure-connector terminals having elongated aperture 70 located in the positions on an insulating film corresponding to the connecting areas between the pressure-connector terminals of pattern leads and terminal electrodes of a substrate.

Figure 27A:
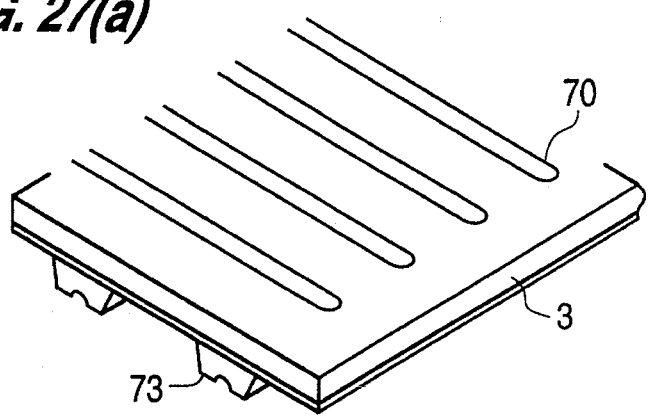
FIGS. 27(a)–27(d) show diagrams for explaining a connecting method of a pressure-connector terminal having through holes at the positions on the insulating film corresponding to the connecting areas between pressure-connector terminals of an outer pattern lead and a terminal electrode on a substrate.

As shown in FIG. 27(a), elongated aperture 70 reaching the connecting areas of the pressure-connector terminals 73 of pattern leads are provided on the insulating film 3 such as a polyimide. (The aperture 70 are provided also through the bonding material 8 which bonds the pressure-connector terminals 73 of pattern leads with the insulating film 3.)

Figure 27B:
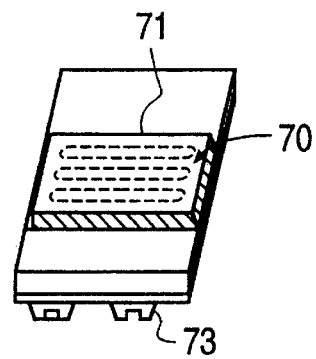

In FIG. 27(b), the bonding material 71 is stuck on the insulating film 3 covering the elongated aperture 70.

Figure 27C:
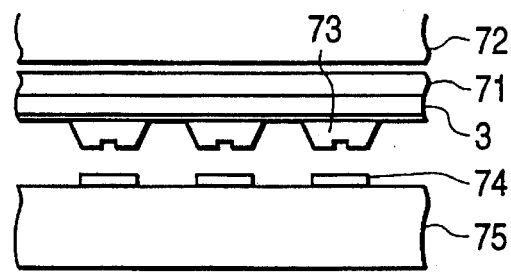

As shown in FIG. 27(c), the pressure-connector terminals 73 are placed in contact with the opposed terminal electrodes 74 formed on a substrate 75, heat and pressure are applied to the bonding material 71 via a heating and pressurizing wedge 72, and thereby the softened bonding material 71 is supplied to the connecting areas between the pressure-connector terminals 73 of pattern leads and terminal electrodes 74 through the aperture 70.

Figure 27D:
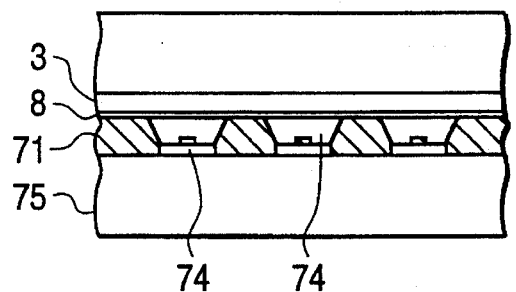

Connection between the pressure-connector terminals of pattern leads and terminal electrodes is established as shown in FIG. 27(d) by hardening the boding material 71 (the hatched areas indicate the hardened bonding material).

Seventh Embodiment:

The first to sixth embodiments all relate to connection of a pressure-connector terminal in such a type as maintaining connection of the pressure-connector terminal with a bonding material. However, it is also possible as a particular use, that any bonding material is not used for maintaining connection of a pressure-connector terminal. This embodiment utilizes a mechanical means for maintaining connection of a pressure-connector terminal.

Figure 28:
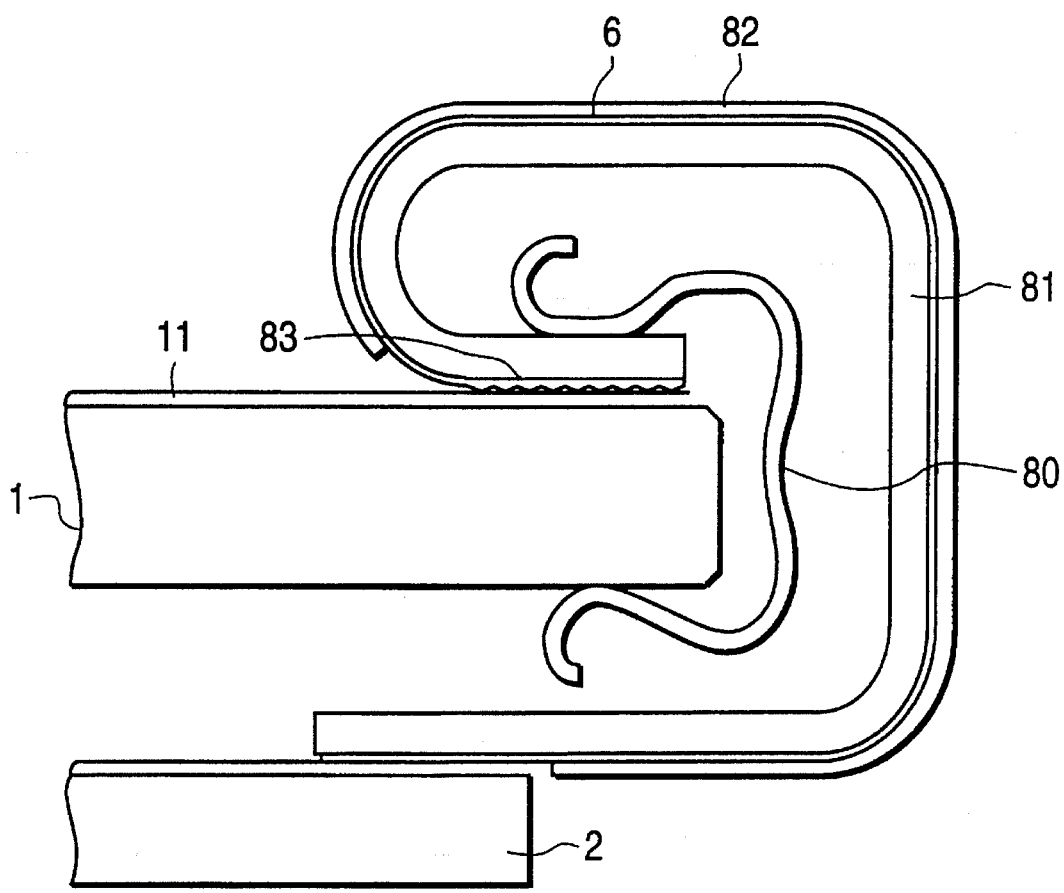
FIG. 28 is a diagram for explaining a connecting method for connecting a pressure-connector terminal of pattern lead of a printed wiring board with a terminal electrode of a panel board using a clip.

FIG. 28 is a diagram for explaining a method of connection for connecting a pressure-connector terminal of a pattern lead on a printed wiring board to a terminal electrode of a panel substrate with a clip.

In this figure, a pattern lead 6 protected by a protection film 82 is provided on a flexible substrate 81 connected to a printed wiring board 2. The printed wiring board 2 and the flexible substrate 81 are soldered. A pressure-connector terminal 83 is formed at the end part of a pattern lead 6 just like the first embodiment.

Meanwhile, a terminal electrode 11 is formed on a panel substrate 1. The pressure-connector terminal 83 and terminal electrode 11 are pressure-connected with a clip (spring) 80. Such connection of pressure-connector terminal is simplified in configuration and ensures higher stability.

We claim:

1. A method of pressure-connection to establish an electrical connection between a terminal having pressure-connector surfaces on an insulating substrate and terminal electrodes formed on a separate substrate comprising the steps of:

forming a plurality of grooves on the connecting surface of said pressure connector terminal surface thereby forming divided connecting surfaces defined by said grooves;

supplying a soft bonding material to an area of the insulating substrate opposite the electrode substrate;

placing the connecting surface of the terminal electrodes in contact with the surfaces of said pressure connector terminal;

applying pressure transverse to said connecting surface thereby forcing the bonding material from the area between said pressure connector surfaces and said terminal electrodes; and hardening said bonding material.

2. The pressure-connecting method according to claim 1, wherein said bonding material is selected from the group of thermosetting resin, thermoplastic resin or a mixture of thermosetting resin and thermoplastic resin.

3. The pressure-connecting method according to claim 1, wherein at least one of said insulating film and substrate is transparent and said bonding material is a photosetting bonding material.

4. A method of pressure-connection to establish an electrical connection between a terminal having a pressure-connector surface on a semiconductor chip and electrodes formed on a separate substrate comprising the steps of:

forming a plurality of grooves on the connecting surface of said pressure connector terminal thereby forming divided connecting surfaces defined by said grooves;

supplying a soft bonding material to an area of the semiconductor chip opposite the electrode substrate;

placing the connecting surface of the terminal electrode in contact with the surface of said pressure connector terminal;

applying pressure transverse to said connecting surface thereby forcing the bonding material from the area between said pressure connector terminal and said terminal electrodes; and hardening said bonding material.

5. A pressure-connecting method according to claim 4, wherein said bonding material is selected from the group of thermosetting resin, thermoplastic resin or a mixture of thermosetting resin and thermoplastic resin.

6. The pressure-connecting method according to claim 4, wherein said substrate is transparent and said bonding material is a photosetting bonding material.

7. A method of pressure-connection to establish an electrical connection between a connecting surface of a pressure connector terminal on a semiconductor chip and a connecting surface of a terminal electrode formed on a separate substrate, comprising the steps of:

forming a plurality of grooves on the connecting surface of said pressure connector terminal thereby forming a divided connecting surface defined by said grooves;

supplying a predetermined quantity of a soft bonding material to an area between the semiconductor chip and the substrate which is opposing the semiconductor chip;

placing the connecting surface of the pressure connector terminal in contact with the connecting surface of said terminal electrode opposed thereto, thereby spreading said bonding material without covering the connecting surface of the terminal electrode;

applying pressure transverse to said connecting surfaces to deform said pressure connector terminal and spread the bonding material so as to partially cover a region including the connecting surface of said terminal electrode, without covering the connecting surface of said terminal electrode; and hardening said bonding material.

8. The pressure-connecting method according to claim 17, said pressure-connecting method further comprising the step of:

partially hardening said bonding material after contacting said pressure-connector terminal with said terminal electrode.

9. The pressure-connecting method according to claim 8, wherein a plurality of pressure-connector terminals are formed on a semiconductor chip which is rectangular in shape and has first and second pairs of opposing sides, the pressure connector terminals being arranged on two parallel lines, the two parallel lines being generally parallel with the first pair of opposing sides and generally perpendicular with the second pair of opposing sides, the two parallel lines being separated from the second pair of opposing sides by a distance equal to at least one half the distance between said parallel lines.

10. The pressure-connecting method according to claim 7, further comprising the step of:

inspecting the connecting condition by supplying an electrical power after partially hardening said bonding material.

11. The pressure-connecting method according to claim 7 wherein a plurality of pressure-connector terminals are formed on a semiconductor chip which is rectangular in shape and has first and second pairs of opposing sides, the pressure connector terminals being arranged on two parallel lines, the two parallel lines being generally parallel with the first pair of opposing sides and generally perpendicular with the second pair of opposing sides, the two parallel lines being separated from the second pair of opposing sides by a distance equal to at least one half the distance between said parallel lines.

12. A method of pressure-connection to establish an electrical connection between a connecting surface of a pressure-connector terminal on a semiconductor chip and a connecting surface of a terminal electrode formed on a separate substrate, comprising the steps of:

forming a first bump of a conducting material on the connecting surface of the pressure-connector terminal on the semiconductor chip;

forming a second bump of a conducting material on the connecting surface of the pressure-connecting terminal on the semiconductor chip, said second bump being higher than said first bump, said second bump placed in contact with a connecting surface of an opposing terminal electrode; and deforming said second bump by contact with said opposed terminal electrode and subsequently applying pressure thereto in the direction transverse to the contact surface.

13. The pressure-connecting method according to claim 12, further comprising the steps of:

forming a third bump on the connecting surface of the pressure connecting terminal, the third bump being higher than said first bump and is lower than said second bump, said third bump being formed of a conducting material which is harder than said second bump.

14. A pressure-connecting method according to claim 13, wherein said second bumps, first bumps and third bumps of the adjacent two pressure-connector terminals are formed on the point-symmetry basis for the middle point of said two pressure-connector terminals.

15. The pressure-connecting method according to claim 12, wherein said second bump and said first bump of the adjacent two pressure-connector terminals are formed on the point-symmetry basis for the middle point of said two pressure-connector terminals.

16. A pressure-connecting method for establishing electrical connection by placing a connecting surface of a pressure-connector terminal of a pattern lead formed on an insulating film in contact with a connecting surface of a terminal electrode formed on a substrate provided opposed thereto and maintaining said electrical connection with stress of bonding material, said pressure-connecting method comprising the steps of:

forming first grooves on a connecting surface of a pressure-connector terminal;

forming second grooves which are crossing said first grooves and are shallower than thickness of said pattern lead;

filling said second grooves with a bonding material which is aligned with said second grooves and does not exceed a connecting surface of a pressure-connector terminal;

placing said pressure-connector terminal in contact with a terminal electrode provided opposed thereto under the condition that said bonding material is softened;

applying pressure in the direction transverse to a contact surface to deform said pressure-connector terminal; and hardening said bonding material.

17. A pressure-connecting method for establishing electrical connection by placing a connecting surface of a pressure-connector terminal of a pattern lead formed on an insulating film in contact with a connecting surface of a terminal electrode formed on a substrate provided opposed thereto and maintaining said electrical connection with stress of bonding material, said pressure-connecting method comprising the steps of:

forming first grooves in the longitudinal direction of a pattern lead on a connecting surface of a pressure-connector terminal;

forming a bank made of an insulator in the direction transverse to said pattern lead keeping a predetermined distance for the end face of a pattern lead;

supplying a bonding material in alignment with a region defined by the end faces of said pattern leads and said bank in such a manner as not exceeding said connecting surface of said pressure-connector terminal;

placing said pressure-connector terminals in contact with terminal electrodes provided opposed thereto under the condition that said bonding material is softened;

applying pressure in the direction transverse to said connecting surface to deform said pressure-connector terminal; and hardening said bonding material.

18. A pressure-connecting method for establishing electrical connection by placing a connecting surface of a pressure-connector terminal of a pattern lead formed on an insulating film in contact with a connecting surface of a terminal electrode formed on a substrate provided opposed thereto and maintaining said electrical connection with stress of bonding material, said pressure-connecting method comprising the steps of:

forming first grooves in the longitudinal direction of a pattern lead on a connecting surface of a pressure-connector terminal;

forming second grooves which are crossing said first grooves and are shallower than thickness of said pattern lead;

supplying a bonding material in alignment with a region of said pressure-connector terminal defined by said pattern leads in such a manner as not exceeding said connecting surface of said pressure-connector terminal;

placing said pressure-connector terminals in contact with terminal electrodes provided opposed thereto under the condition that said bonding material is softened;

applying pressure in the direction transverse to a connecting surface to deform said pressure-connector terminal; and hardening said bonding material.

19. A pressure-connecting method for establishing electrical connection by placing a connecting surface of a pressure-connector terminal of a pattern lead formed on an insulating film in contact with a connecting surface of a terminal electrode formed on a substrate provided opposed thereto and maintaining said electrical connection with stress of bonding material, said pressure-connecting method comprising the steps of:

forming grooves at least consisting of the one of the first grooves in the longitudinal direction of a pattern lead and the second grooves in the width direction thereof on a connecting surface of a pressure-connector terminal;

forming through holes reaching the connecting areas of said pressure-connector terminal on said insulating film;

attaching a bonding material at the position covering said grooves on said insulating film;

placing said pressure-connector terminal in contact with a terminal electrode under the condition that said bonding material is softened;

applying pressure in the direction transverse to a connecting surface to deform said pressure-connector terminal and simultaneously supplying said softened bonding material to connecting areas of pressure-connector terminals of pattern leads and terminal electrodes from said through holes; and hardening said bonding material.

20. A pressure-connecting method for establishing electrical connection by placing a connecting a surface of a pressure-connector terminal in contact with a connecting surface of a terminal electrode, said pressure-connecting method, comprising the steps of:

forming a plurality of grooves on a connecting surface of a pressure-connector terminal to form divided connecting surfaces of a plurality of divided terminals defined by said grooves;

placing divided connecting surfaces of said pressure-connector terminal in contact with a connecting surface of said terminal electrode and applying pressure in the direction transverse to said connecting surface to deform said divided terminal; and maintaining electrical connection with a clip means of said terminal electrode provided opposed to said pressure-connector terminal.

21. A method of pressure-connection to establish an electrical connection between a connecting surface of a pressure-connector terminal of a pattern lead formed on an insulating film and a connecting surface of a terminal electrode formed on a separate substrate, comprising the steps of:

forming first grooves on the connecting surface of the pressure-connector terminal;

forming second grooves intersecting said first grooves, said second grooves being shallower than the thickness of said pattern lead;

filling said second grooves with a bonding material which is aligned with said second grooves and does not extend beyond the connecting surface of the pressure-connector terminal;

placing said pressure-connector terminal in contact with the terminal electrode while said bonding material is soft;

applying pressure transverse to the connecting surfaces to deform said pressure-connector terminal; and hardening said bonding material.

22. A method of pressure-connection to establish an electrical connection between a terminal of a pattern lead formed on an insulating film having a pressure-connector surface and terminal electrodes formed on a separate substrate comprising the steps of:

forming first grooves in the longitudinal direction of a pattern lead on a connecting surface of a pressure-connector terminal;

forming a bank made of an insulator transverse to said pattern lead keeping a predetermined distance from an end face of a pattern lead;

supplying a bonding material in alignment with a region defined by the end faces of said pattern leads and said bank in such that said bonding material does not extend beyond said connecting surface of said pressure-connector terminal;

placing said pressure-connector terminal in contact with said terminal electrodes while said bonding material is softened;

applying pressure transverse to said connecting surface to deform said pressure-connector terminal; and hardening said bonding material.

23. A method of pressure-connection to establish an electrical connection between a terminal of a pattern lead formed on an insulating film having a pressure-connector surface and a connecting surface of a terminal electrode formed on a separate substrate comprising the steps of:

forming first grooves in the longitudinal direction of a pattern lead on a connecting surface of a pressure-connector terminal;

forming second grooves intersecting said first grooves, said second grooves being shallower than thickness of said pattern lead;

supplying a bonding material in alignment with a region of said pressure-connector terminal defined by said pattern leads such that said bonding material does not extend beyond said connecting surface of said pressure-connector terminal;

placing said pressure-connector terminals in contact with the connecting surface of the terminal electrodes while said bonding material is softened;

applying pressure transverse to a connecting surface to deform said pressure-connector terminal; and hardening said bonding material.

24. A method of pressure-connection to establish an electrical connection between a terminal of a pattern lead on an insulating film having a pressure-connector surface and terminal electrodes formed on a separate substrate comprising the steps of:

forming grooves consisting of at least one groove in the longitudinal direction of a pattern lead and one groove in a directing intersecting said longitudinal direction on a connecting surface of a pressure-connector terminal;

forming through holes reaching the connecting surfaces of said pressure-connector terminal on said insulating film;

applying a bonding material at the position covering said grooves on said insulating film;

placing said pressure-connector terminal in contact with the terminal electrodes while said bonding material is softened;

applying pressure transverse to the connecting surface to deform said pressure-connector terminal and simultaneously supplying said softened bonding material to connecting areas of pressure-connector terminals of pattern leads and terminal electrodes from said through holes; and hardening said bonding material.

* * * * *

UNITED STATES PATENT AND TRADEMARK OFFICE
CERTIFICATE OF CORRECTION

PATENT NO. : 5,517,752
DATED : May 21, 1996
INVENTOR(S) : Toshio SAKATA et al.

It is certified that error appears in the above-indentified patent and that said Letters Patent is hereby corrected as shown below:

<u>Title Page</u>, column 2, line 1, change "4,294,572" to --4,694,572--.

<u>Col. 1</u>, line 13, after "realizing" insert --a--;
    line 20, change "temrinals" to --terminals--; and
    line 22, delete "the".

<u>Col. 2</u>, line 45, change "12" to --14--;
    line 49, after "16." begin a new paragraph; and
    line 54, change "contactness" to --contact--.

<u>Col. 3</u>, line 30, change "enter" to --enters--

<u>Col. 4</u>, line 45, change "lest" to --least--.

<u>Col. 6</u>, line 10, change "show" to --are diagrams--.

<u>Col. 7</u>, line 20, change "method" to --methods--; and
    line 21, change "terminal" to --terminals--.

<u>Col. 8</u>, line 45, after "of" insert --the--.

<u>Col. 10</u>, line 67, after "with" insert --a--.

<u>Col. 11</u>, line 8, "The COG..." starts a new paragraph; and
    line 9, after "value" insert --,--.

<u>Col. 12</u>, line 8, change "22" to --42--; and

UNITED STATES PATENT AND TRADEMARK OFFICE
CERTIFICATE OF CORRECTION

PATENT NO. : 5,517,752
DATED : May 21, 1996
INVENTOR(S) : Toshio Sakata, et al.

It is certified that error appears in the above-indentified patent and that said Letters Patent is hereby corrected as shown below:

Col. 12, line 9, change "23" to --43--.

Signed and Sealed this

Tenth Day of September, 1996

Attest:

BRUCE LEHMAN

Attesting Officer          Commissioner of Patents and Trademarks